United States Patent
Lindemann et al.

(10) Patent No.: US 6,774,448 B1
(45) Date of Patent: Aug. 10, 2004

(54) HIGH SPEED DETECTORS HAVING INTEGRATED ELECTRICAL COMPONENTS

(75) Inventors: John Hart Lindemann, Louisville, CO (US); Michael Thomas Dudek, Longmont, CO (US); David Galt, Denver, CO (US)

(73) Assignee: Optical Communication Products, Inc., Woodland Hills, CA (US)

(*) Notice: Subject to any disclaimer, the term of this patent is extended or adjusted under 35 U.S.C. 154(b) by 0 days.

(21) Appl. No.: 10/017,786

(22) Filed: Nov. 30, 2001

Related U.S. Application Data

(60) Provisional application No. 60/250,054, filed on Nov. 30, 2000.

(51) Int. Cl.[7] .............................................. H01L 31/00
(52) U.S. Cl. ...................... 257/443; 257/438; 257/458; 257/466
(58) Field of Search ................................ 257/438, 443, 257/444, 458, 466

(56) References Cited

U.S. PATENT DOCUMENTS

| | | | | | |
|---|---|---|---|---|---|
| 3,849,678 | A | * | 11/1974 | Flynn | 257/466 |
| 5,132,541 | A | * | 7/1992 | Conrads et al. | 257/444 |
| 5,448,099 | A | * | 9/1995 | Yano | 257/466 |

* cited by examiner

*Primary Examiner*—Gene M. Munson
(74) *Attorney, Agent, or Firm*—Barlow, Josephs & Holmes, Ltd.

(57) ABSTRACT

An opto-electronic device configured as a photodetector has a capacitor and/or resistor monolithically formed on a surface of the photodetector. The capacitor capacitively couples the AC ground of the photodetector to the bias terminal of the photodetector. The on chip capacitor design eliminates the inductance of external circuit traces between the power supply and an external capacitor. The resistor forces the AC return current of the photodetector through the AC ground in preference to the typical (DC bias terminal) path. Combinations of capacitors and resistors are particularly effective in reducing crosstalk among adjacent detectors in arrays.

29 Claims, 26 Drawing Sheets

HIGH SPEED DETECTORS HAVING INTEGRATED ELECTRICAL COMPONENTS

CROSS-REFERENCE TO RELATED APPLICATION

This application claims priority to U.S. Provisional Patent application Serial No. 60/250,054, entitled "INTEGRATED CAPACITOR ON HIGH SPEED DETECTOR" filed on Nov. 30, 2000 the content of which is incorporated herein by reference.

FIELD OF THE INVENTION

The present invention generally relates to optoelectronic devices and more particularly relates to high speed photodetectors having integrated electrical components.

BACKGROUND

High-speed optical receivers use a photodetector to convert a received optical signal to an output current signal. The output a current signal is typically coupled to the input of a transimpedance amplifier (TIA) that converts the current signal to a voltage signal.

Optical receivers and monitors using high speed photodetectors and TIAs typically integrate an external capacitor between the power supply and ground. The external capacitor substantially reduces the reception of power supply transients by the TIA that might otherwise be received and amplified into a noise contribution to the output signal. However, the output of the photodetector is typically wire bonded to the input of the external TIA. The wire bonds introduce a parasitic inductance that tends to degrade the signal generated by the photodetector.

In addition the return path for this signal is from the TIA ground through wire bonds to the circuit board, then through traces on the circuit board, the external capacitor and additional wire bonds, to the photodetector. This path also introduces parasitic inductance, which may also degrade the signal out of the transimpedance amplifier.

SUMMARY OF THE INVENTION

In one aspect of the present invention a photodetector includes an AC ground capacitively coupled to a bias terminal of the photodetector. The present invention therefore, capacitively couples the power supply voltage Vcc to ground at the point where the unamplified current signal generated by the photodetector is passed to a TIA. Advantageously, the described exemplary on chip capacitor design eliminates the inductance of external circuit traces between the power supply and an external capacitor.

The present invention is not limited to a particular photodetector. Rather the present invention may be used with a plurality of photodetectors such as for example an MSM (Metal-Semiconductor-Metal photodetector), avalanche photodiode or PIN photodiode.

In a further aspect of the present invention an opto-electronic device includes a photodetector having a capacitor formed monolithically on the same substrate as the photodetector, wherein the capacitor is coupled between the photodetector AC ground and the photodetector bias terminal.

In another aspect of the present invention an opto-electronic device includes a monolithic bias resistor formed between the cathode of the photodetector and the bias terminal.

In a still further aspect of the present invention an opto-electronic device includes an array of photodetectors, wherein two or more of the photodetectors have a monolithic capacitor(s) formed on the same substrate as the photodetector that capacitively couples the photodetectors' AC grounds to a bias terminal of the array, and/or a monolithic bias resistor(s) formed between each cathode of the photodetector and a common array bias terminal.

It is understood that other embodiments of the present invention will become readily apparent to those skilled in the art from the following detailed description, wherein are shown and described only embodiments of the invention by way of illustration of the best modes contemplated for carrying out the invention. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

These and other features of the present invention will be better understood by reading the following detailed description in conjunction with the accompanying drawings, wherein.

DETAILED DESCRIPTION OF THE INVENTION

There is provided according to an exemplary embodiment of the present invention, an opto-electronic device configured as a photodetector having a capacitor and/or resistor monolithically formed on a surface of the photodetector. The capacitor capacitively couples the AC ground of the photodetector to the bias terminal of the photodetector. The on chip capacitor design eliminates the inductance of external circuit traces between the power supply and an external capacitor. The resistor forces the AC return current of the photodetector through the AC ground in preference to the typical (DC bias terminal) path. Combinations of capacitors and resistors are particularly effective in reducing cross-talk among adjacent detectors in arrays.

Figure 1:
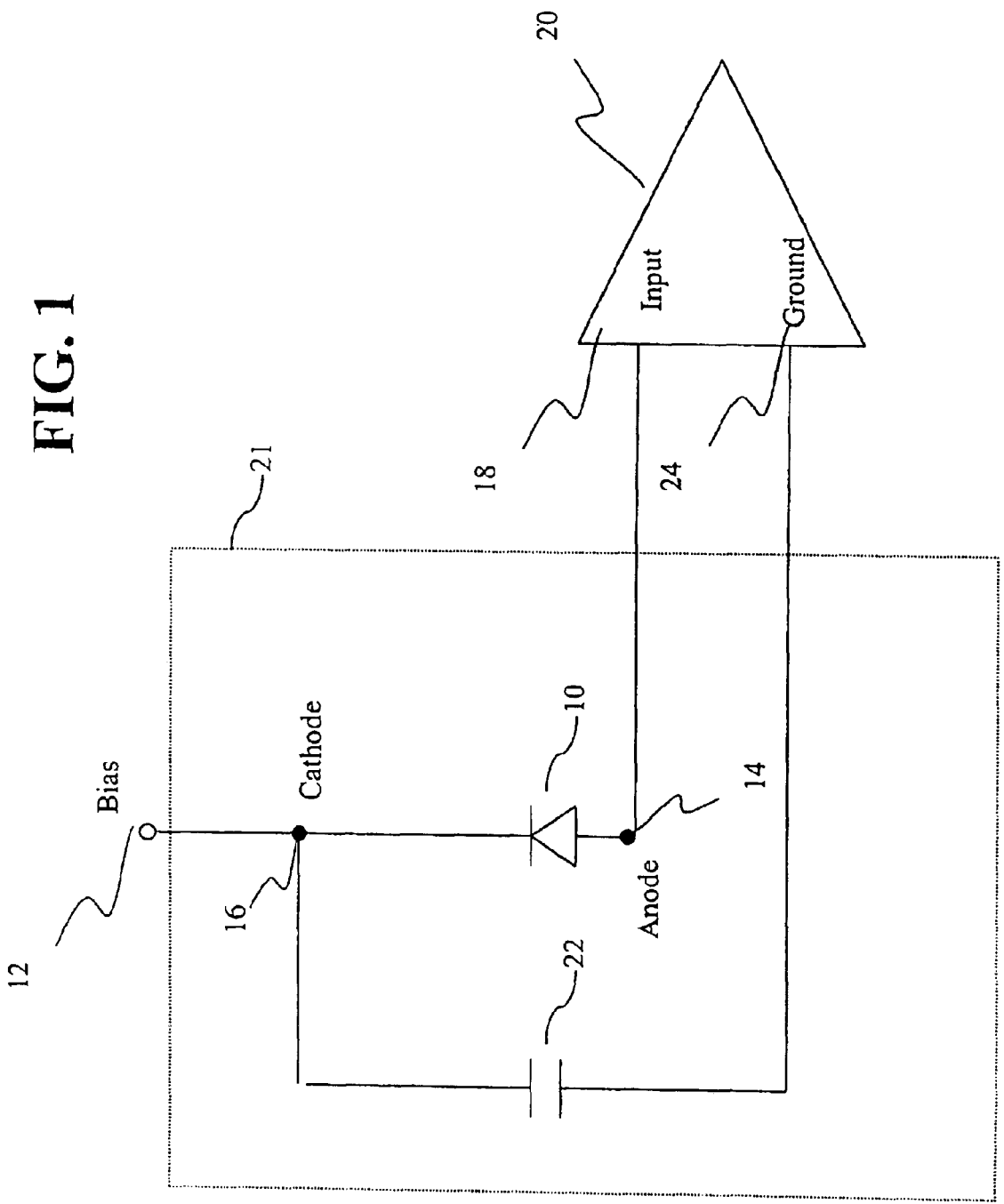
FIG. 1 is a simplified circuit diagram of an optical receiver comprising a photodetector for receiving an optical signal and a transimpedance amplifier for amplifying the output of the photodetector wherein an integrated capacitor is monolithically formed on the photodetector between AC ground and the photodetector bias in accordance with an exemplary embodiment of the present invention.

For example, referring to the simplified circuit diagram of FIG. 1, when a light beam is incident on the light receiving area of a photodetector 10, electron-hole pairs are generated. A DC bias voltage 12 is applied to the cathode of the photodetector, so that electrons and holes generated by incident light are moved by the electric field within the photodetector to bring about a flow of electric current having an intensity proportional to the intensity of the incident light.

The output current signal of the photodetector 10 may be electrically coupled via wire bond to an input 18 of a transimpedance amplifier (TIA) 20. The transimpedance amplifier converts the current signal to an output voltage signal. An exemplary optical receiver may further include a capacitor 22 coupled between bias 12 and ground 24. The capacitor 22 shunts power supply transients past components that may be damaged by high voltages and in doing so, excludes these transients from the input of the TIA where they would be passed on and amplified as undesirable noise. In accordance with an exemplary embodiment capacitor 22 may be monolithically integrated on the same chip 21 with photodetector 10 to mitigate the problems associated with the use of external capacitors in convention detector designs.

Figure 2:
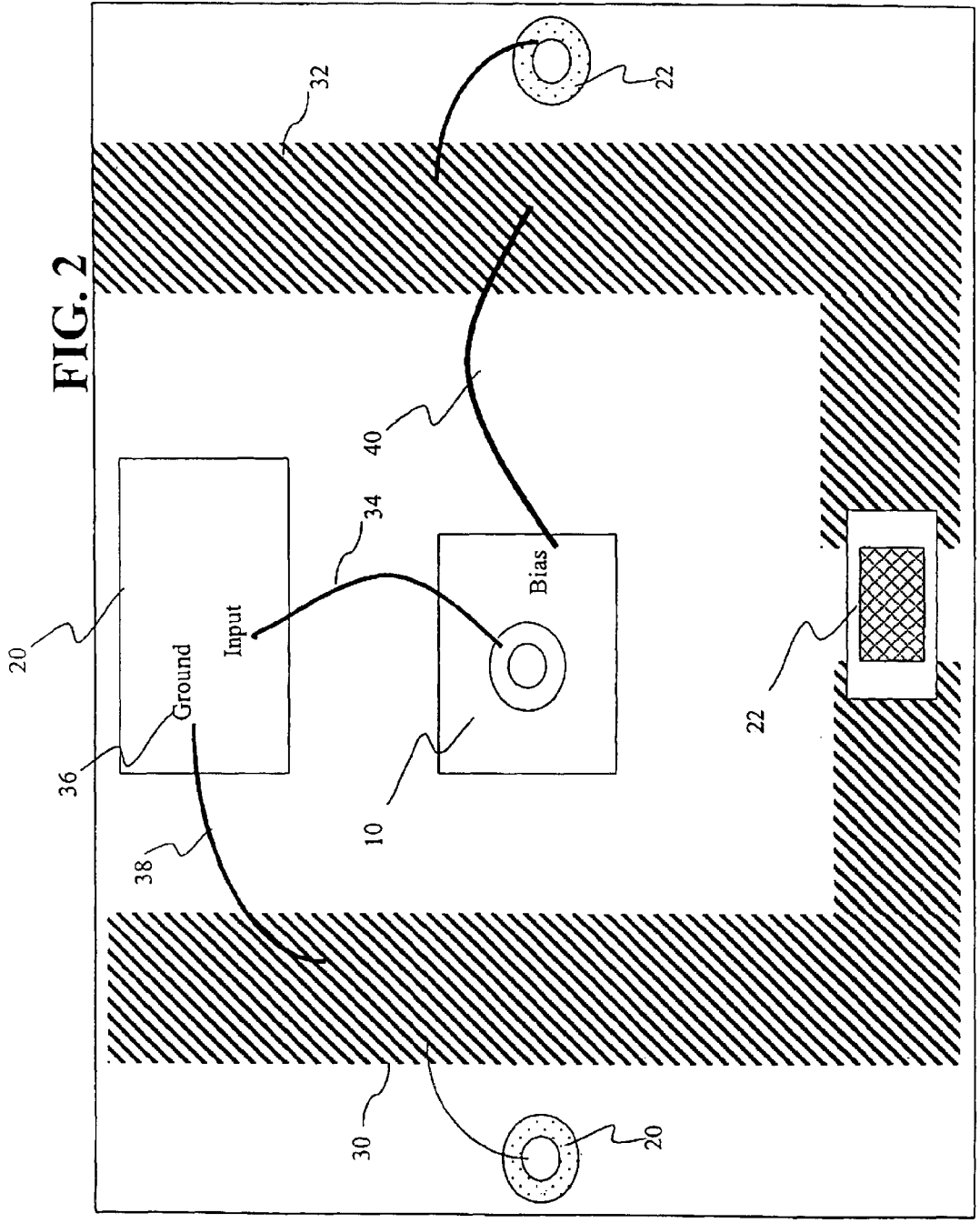
FIG. 2 is a planview of a simplified optical receiver wherein an external capacitor is coupled between a power source trace and ground.

Referring to FIG. 2, in a conventional detector and receiver design the capacitor 22 is often externally coupled between a ground pattern 30 and source pattern 32 on the mounting substrate or circuit board. In this instance, the return path for the AC source signal 34 is from the transimpedance amplifier ground 36 through a wire bond 36 to the ground trace 30 on the substrate, through the external capacitor 22 and then through an additional wire bond 40 to the photodetector 10. This return path in a conventional photodetector and receiver design introduces parasitic inductance, which may degrade the signal out of the transimpedance amplifier.

Figure 3:
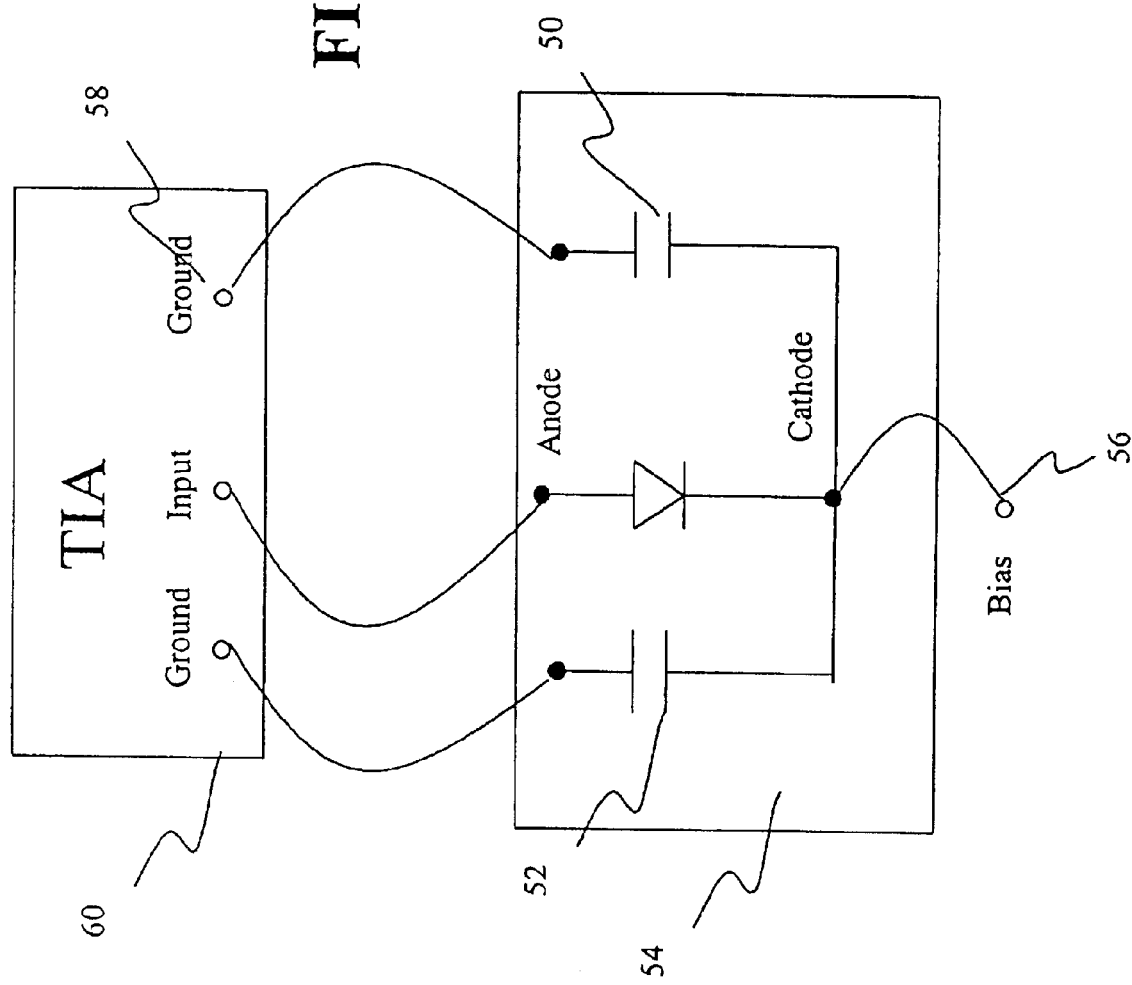
FIG. 3 is a simplified block diagram of an optical receiver comprising a photodetector with an integrated capacitor coupled between the detector bias and ground in accordance with an exemplary embodiment of the present invention.

Referring to FIG. 3, in the described exemplary embodiment, one or more capacitors 50 and 52 may be integrated directly on a photodetector 54 between the photodetector bias 56 and AC ground 58 of the TIA 60. Advantageously, in the described exemplary embodiment the photodetector and transimpedance amplifier may be electrically coupled via parallel ground and signal paths (i.e. ground, signal, ground) if desired. The parallel ground coupling reduces the inductive losses or signal distortion normally associated with a single wirebond, as the inductive coupling of the wirebonds can be engineered to form an air bridge waveguide. In addition the replacement of a long return path through circuit board traces etc. as normally utilized in a conventional design with wirebonds as in the described exemplary embodiment also reduces the parasitic inductance of the signal return path.

In order to appreciate the advantages of the present invention, it will be beneficial to describe the invention in the context of an exemplary embodiment such as for example a photodetector comprising a P-I-N photodiode. One of skill in the art will appreciate that the present invention may be practiced with other photodetectors, such as for example, a metal-semiconductor metal (MSM) photodetector or an avalanche photodiode. Further, although the exemplary embodiment discussed may generally be considered an example of a 'mesa' photodiode, one of skill in the art will appreciate that the present invention may be readily adapted to 'planar' processing techniques. For example the present invention may be utilized with a diffused photodiode structure rather than an etched P-I-N structure. One of skill in the art will further appreciate that photodiodes may also be packaged with the cathode grounded, in which case a negative signal is applied to the anode to reverse bias the device, or may be fabricated in reverse physical sequence as an N-I-P diode. Therefore, the disclosed exemplary P-I-N photodiode embodiment is simply by way of example and not by way of limitation, and all references to 'anode', 'cathode', 'n-type', 'p-type' etc. should be construed as modified as appropriate for application to other device structures or types.

Figure 4:
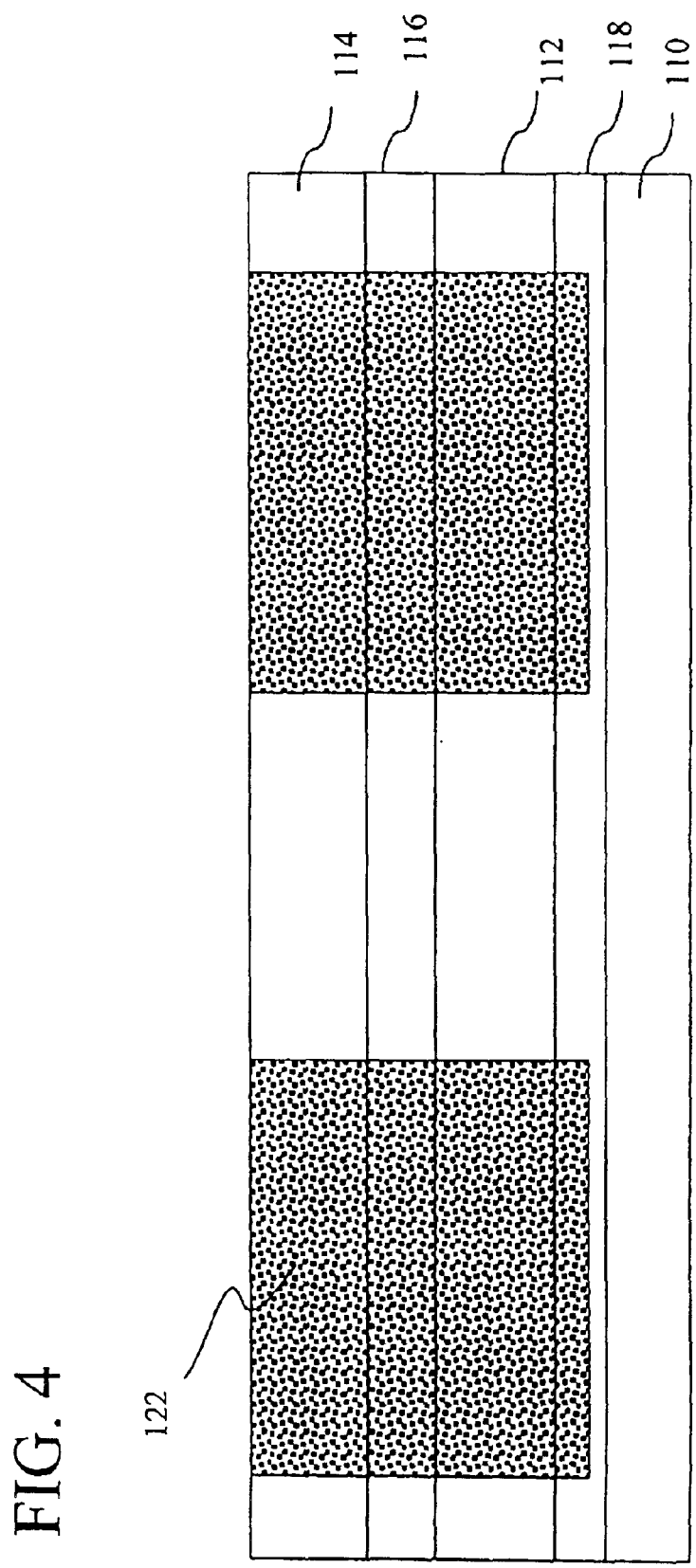
FIG. 4 is a cross-sectional view showing a semiconductor wafer forming a P-i-N junction in accordance with an exemplary embodiment of the present invention.

FIG. 4 is a cross-sectional view showing a semiconductor wafer having a lower n-type layer 112, an upper p-type layer 114, and an intrinsic layer 116 formed between the lower n-type layer 112 and the upper p-type layer 114. In this and other embodiments like reference numerals may be used to represent like features. One of skill in the art will appreciate that the orientation and type of materials forming the photodetector may be varied depending on the design. Therefore, the disclosed photodetector is by way of example and not by way of limitation.

In an exemplary embodiment of the present invention, the PIN photodetector may be formed on a gallium arsenide (GaAs) substrate 110 or a substrate formed from other semi-insulating material. An exemplary PIN photodetector may also include a semiconductor mirror 118 formed above the substrate 110 and beneath the lower n-type layer 112 to increase the responsivity of the photodetector.

One of skill in the art will appreciate that the semiconductor mirror 118 may not be needed if intrinsic layer 116 absorbs a sufficient amount of light. In an exemplary embodiment in which VCSELs (vertical cavity surface emitting lasers) are formed on the same substrate, the semiconductor mirror may also serve as the lower VCSEL mirror for the VCSELs discretely formed on other parts of the substrate.

In the described exemplary embodiment, lower n-type layer 112 may be formed of aluminum gallium arsenide (AlGaAs). Similarly, the intrinsic layer 16 may be epitaxially formed on the lower n-type layer 112 from gallium arsenide or other materials known in the art. In an exemplary embodiment the intrinsic layer 116 may be lattice matched to the substrate 110 and any intervening layers. In an exemplary embodiment the intrinsic layer 116 is chosen to be thick enough to maximize absorption and responsivity but thin enough to minimize transit time of the charge carriers created by photons which are absorbed in the intrinsic layer, so as to comply with high-speed requirements.

After the lower n-type layer, intrinsic layer, upper p-type layer and any intervening layers are formed an implant process may be carried out to implant an appropriate ionic species into a portion of each layer. The implantation process is performed after masking an active area with a material having a high atomic mass that blocks the implanted species. The implantation process implants ions to convert each of the implanted layers to an electrically insulating material 122 above which metal interconnect features may be formed. In an exemplary embodiment using Gallium Arsenide as the semiconductor material system, the ionic species may be protons.

Figure 5:
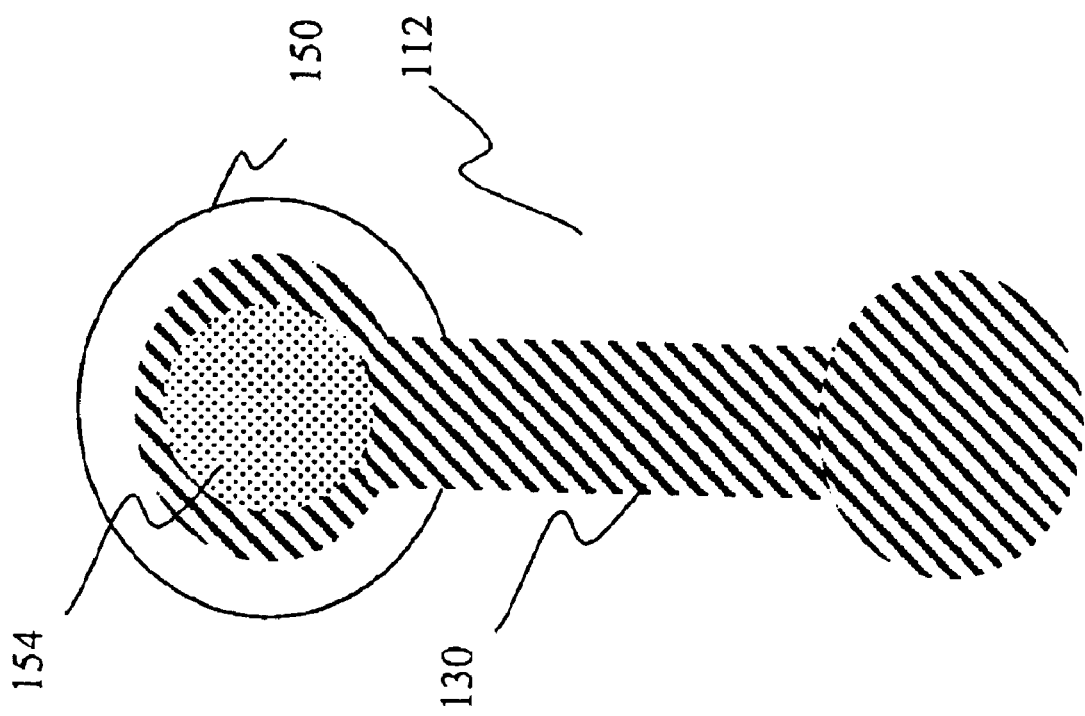
FIG. 5 is a planview illustrating a mesa etched in the PIN photodetector of FIG. 4 to expose a portion of an n-type semiconductor layer in accordance with an exemplary embodiment of the present invention.

Referring to the plan view shown in FIG. 5, in an exemplary embodiment of the present invention, a mesa may be formed by etching down to the n-type layer 112. The mesa may be formed by lithographically patterning the top surface of the upper p-type layer 114. The etch step may involve the use of an etch stop layer, as will be obvious to one skilled in the art.

In the described exemplary embodiment, the mesa structure 150 is generally circular in cross-section. According to other exemplary embodiments, the mesa structure may take on different configurations such as rectangular, square, elliptical, or other geometrical shapes.

In the circular embodiment shown in FIG. 5, the diameter of the photodetector active region 154 may range from less than about 10 microns to greater than about 1000 microns. The diameter of the active region is typically chosen in conjunction with the specific application of the photodetector. In practice the photodetector is often sized in accordance with the data rate requirements of the application and if possible to allow for passive alignment between the photodetector and the fiber optic or other optical medium to which it is coupled.

In the described exemplary embodiment, a p-type ohmic contact 130 may be formed directly on portions of upper p-type layer. According to an exemplary embodiment, the p-type ohmic contact 130 may be formed over the entire device as a single ohmic film. When a gallium arsenide material system is used, the p-type ohmic contact 130 may be, for example, gold with beryllium (Au/Be) added or a layered structure of titanium/platinum/gold (Ti/Pt/Au). The film is patterned and etched using conventional methods.

Figure 6:
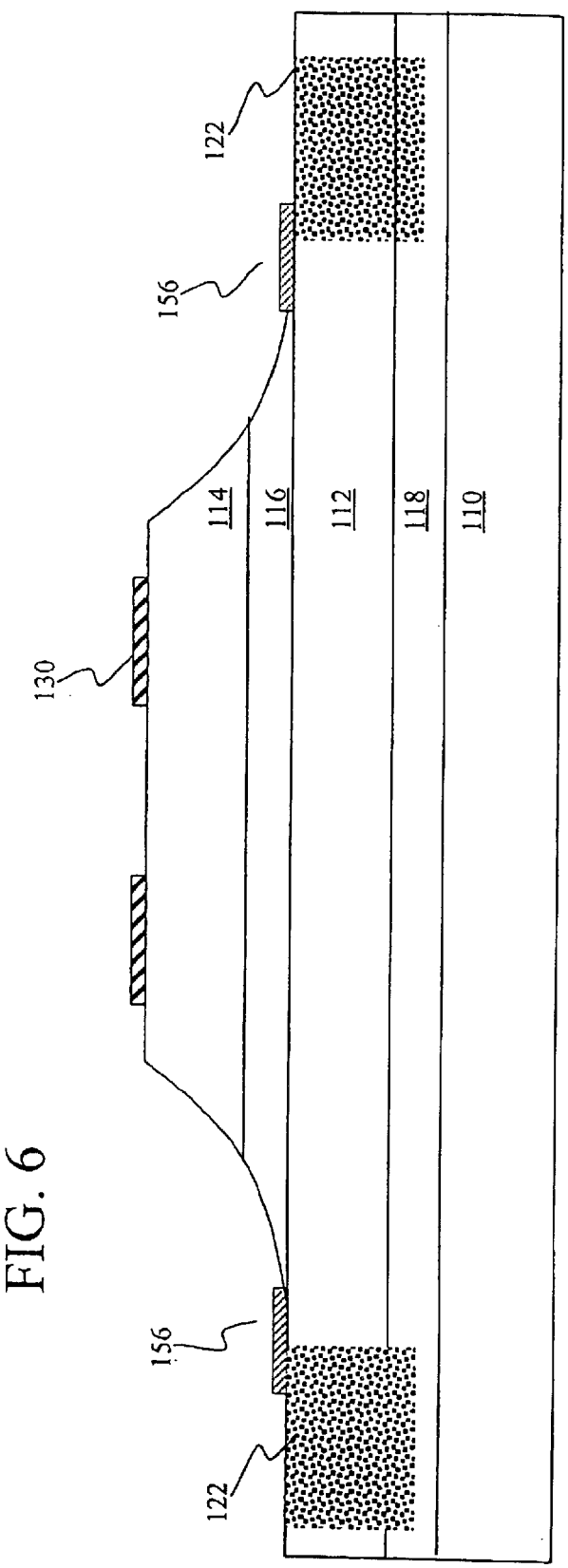
FIG. 6 is a cross-sectional view of a PIN photodetector in accordance with an exemplary embodiment of the present invention.
Figure 7:
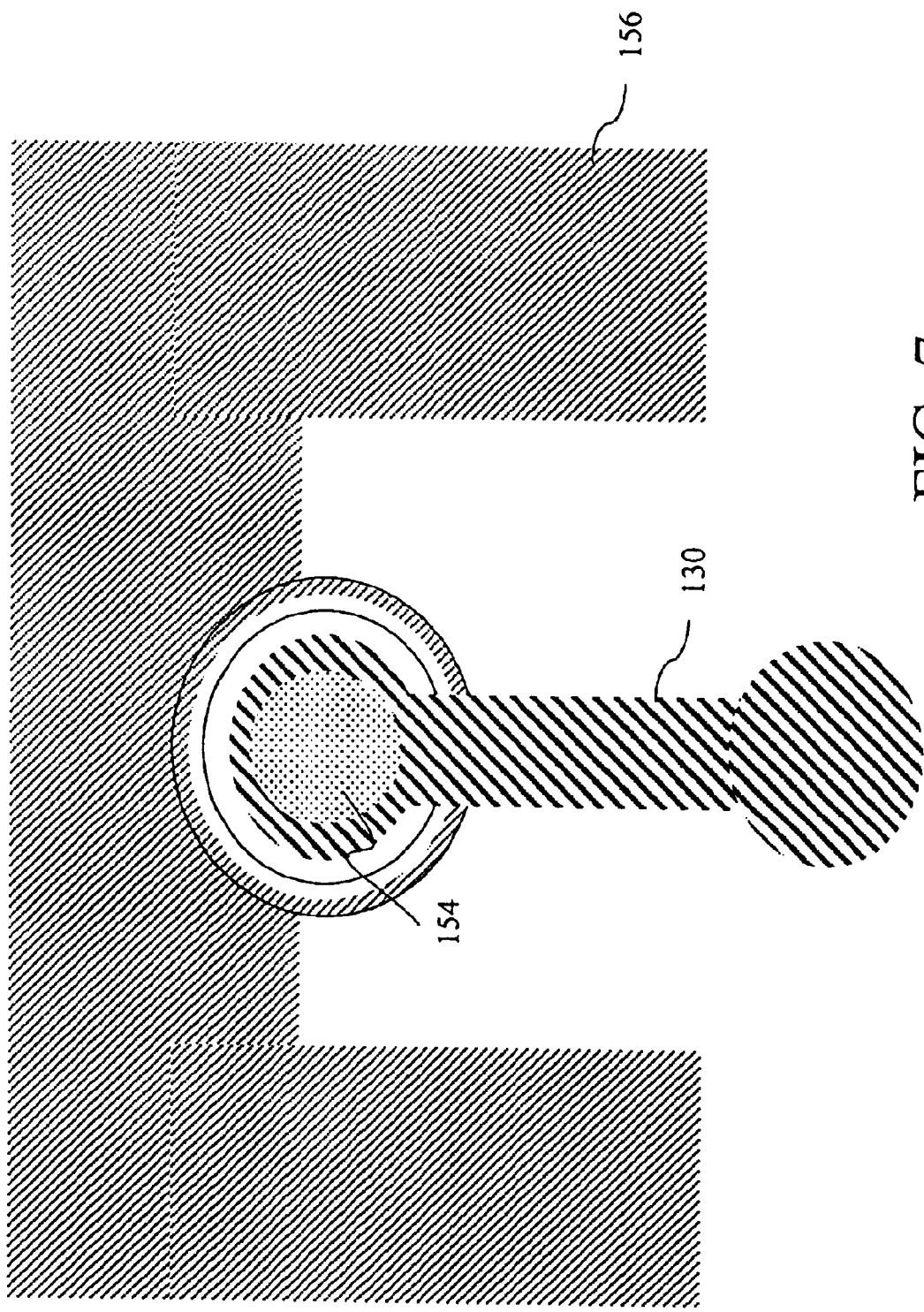
FIG. 7 is a planview showing an n-type ohmic contact forming a ring extending circumferentially around the mesa structure and in direct contact with the lower n-type layer in accordance with an exemplary embodiment of the present invention.

Referring to FIG. 6, in the described exemplary embodiment, an n-type ohmic contact 156 may be formed on a portion of the exposed n-type layer 112 to electrically contact the n-type layer 112 and implant region 122. The n-type ohmic contact 156 may be formed, for example, from AuGe/Ni/Ge deposited by electron beam evaporation or sputtering. Referring to the planview of FIG. 7, the n-type ohmic contact 156 may form a ring extending circumferentially around the mesa structure and in direct contact with the lower n-type layer.

Figure 8:
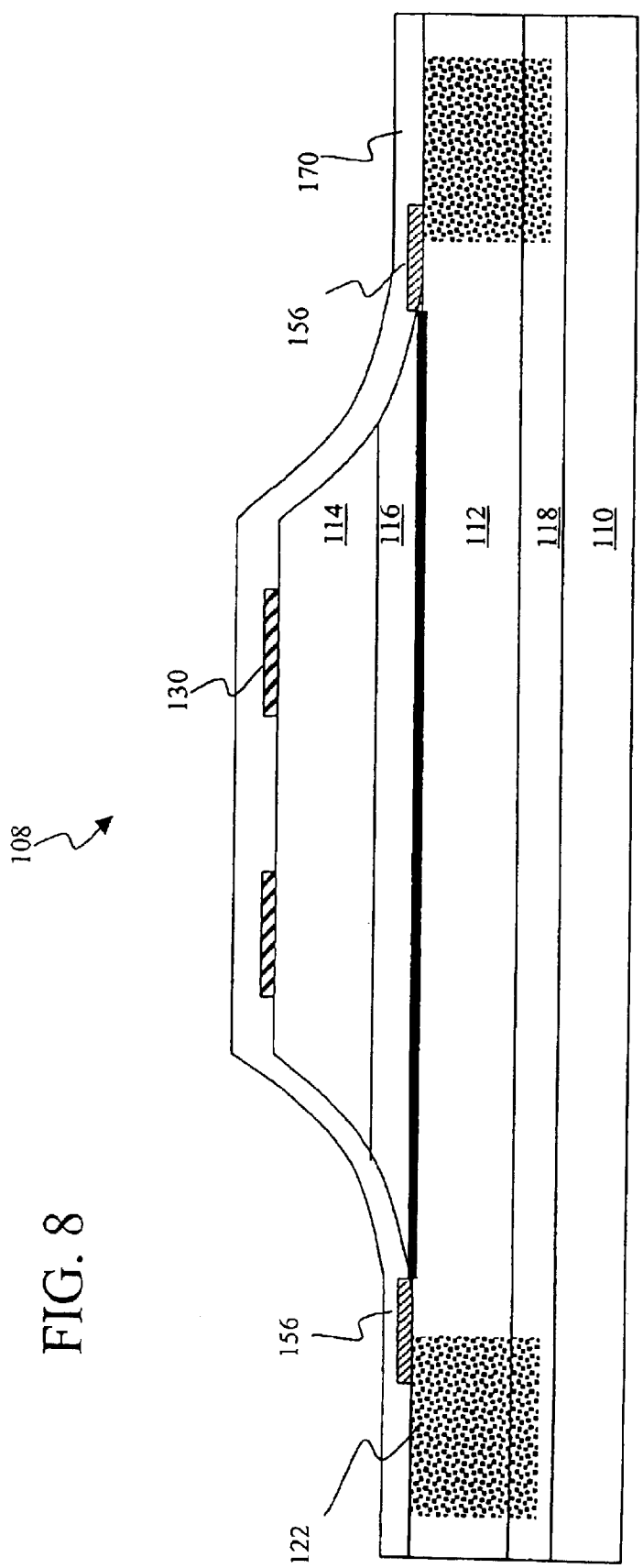
FIG. 8 is a cross-sectional view of the PIN photodetector of FIG. 5 wherein a dielectric passivation layer is deposited across the uppermost exposed surfaces in accordance with an exemplary embodiment of the present invention.

After the ohmic contacts are formed and patterned, a dielectric layer 170, such as for example a passivation layer may be deposited as shown in the cross-sectional view of FIG. 8. The passivation layer 170 is chosen to be transmissive to light at the desired wavelength, and may be optimized in thickness and refractive index by techniques known to those skilled in the art to reduce reflections of incoming light from the P-I-N photodiode structure. In various exemplary embodiments, the passivation layer comprises an odd number of quarter wavelength thick layers of silicon dioxide ($SiO_2$), silicon nitride ($Si_3N_4$), silicon oxynitride, or other organic or inorganic dielectric materials in common use in semiconductor fabrication.

Figure 9:
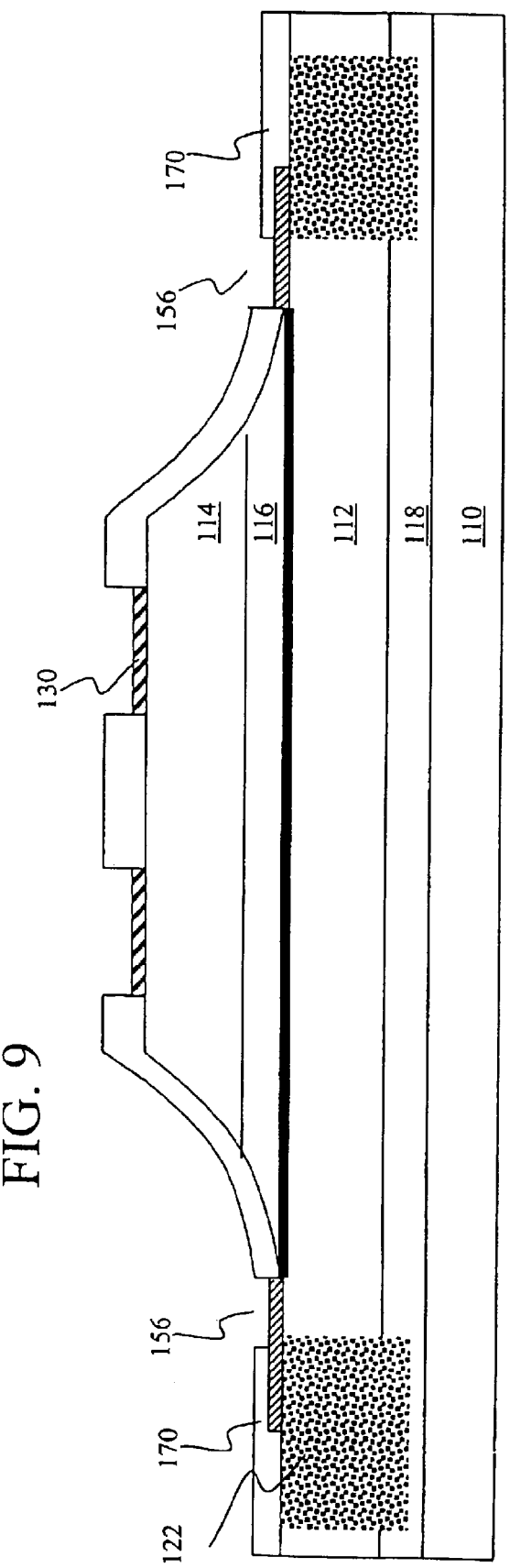
FIG. 9 is a cross-sectional view of the PIN photodetector of FIG. 8 wherein vias are formed in the dielectric passivation layer to expose the n-type and p-type ohmic contacts in accordance with an exemplary embodiment of the present invention.

In an exemplary embodiment, the metal deposits used for the n-type and p-type ohmic contacts 156, 130 may be thin with a relatively high resistance. Therefore, referring to FIG. 9, in an exemplary embodiment contact openings or vias may be formed in the passivation layer 170 to provide access to the n-type and p-type ohmic contact. Referring to the cross-sectional view of FIG. 10, in an exemplary embodiment an interconnect metal 180(*a*), 180(*b*), and 182(*a*), 182(*b*) may be separately formed on each of the ohmic contacts. In the described exemplary embodiment the interconnect metal provides a low resistance path for current flow.

The interconnect metal 180(*a*), 180(*b*) and 182(*a*), 182(*b*) may be formed and patterned using conventional methods. Interconnect metal may be used to reduce the resistance of the n-type ohmic contact 156, the p-type ohmic contact 130, or both. Interconnect metal may also be used to route metallization to other areas of the detector chip.

Figure 10:
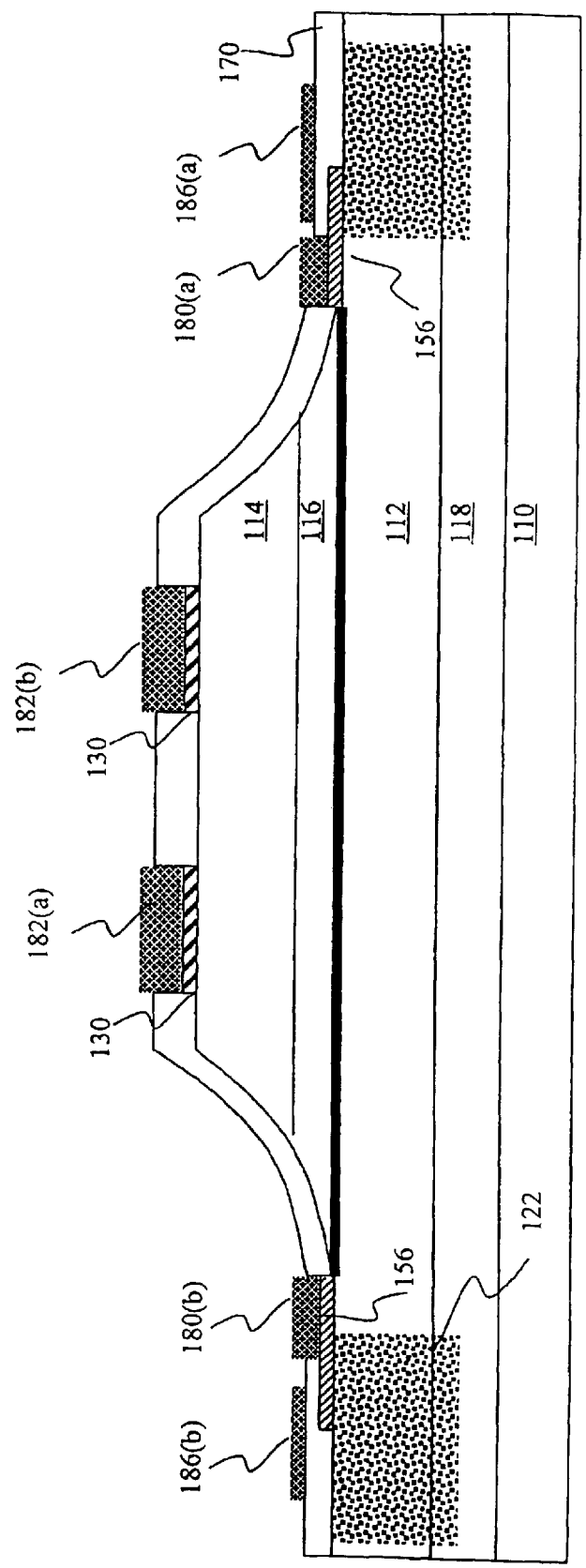
FIG. 10 is a cross-sectional view of the PIN photodetector of FIG. 9 wherein a low resistance metal interconnect layer is formed on said p-type ohmic contact and forms AC ground pads that are capacitively coupled to the n-type ohmic contact through the dielectric passivation layer.
Figure 11:
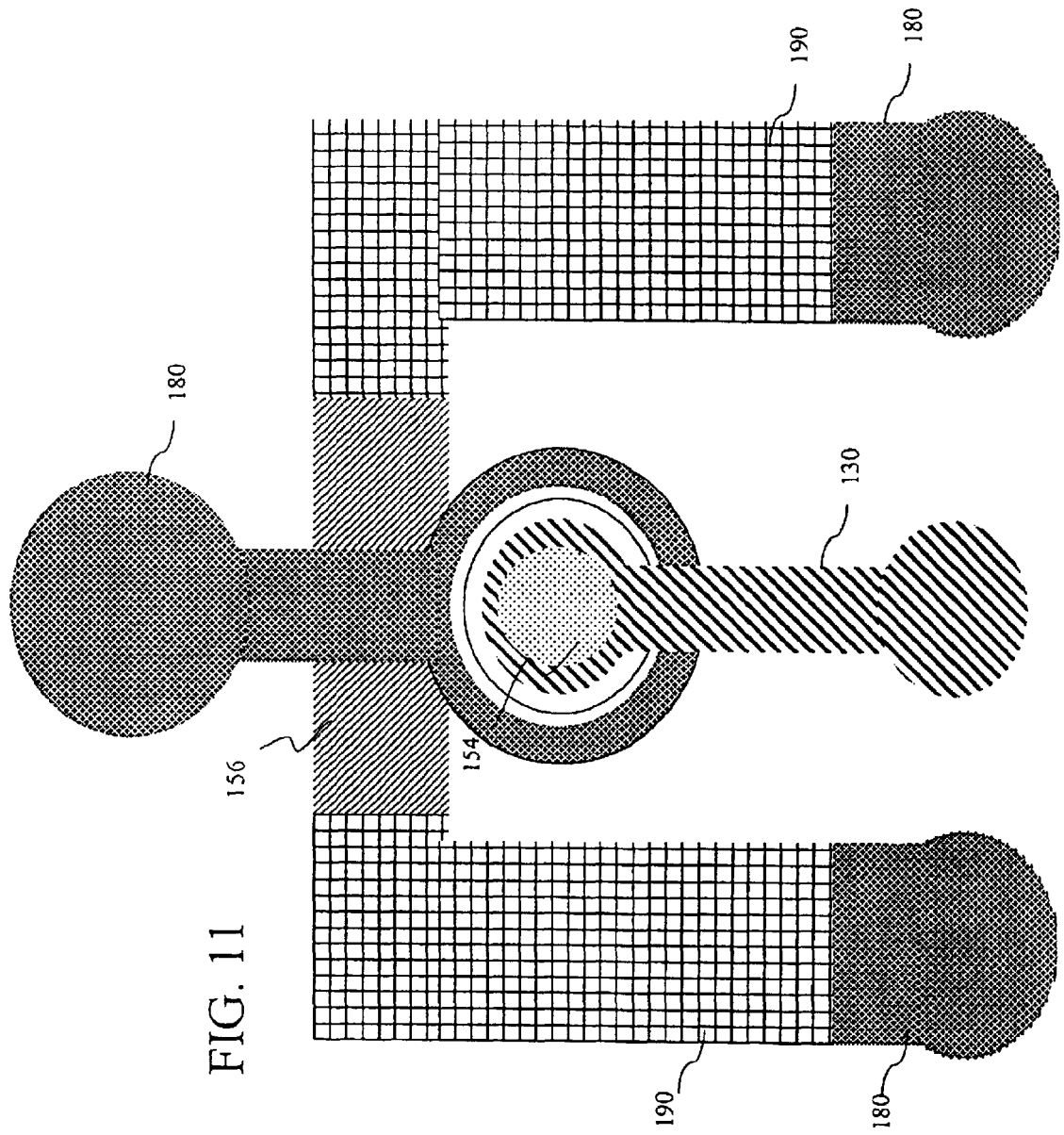
FIG. 11 is a planview of the photodetector of FIG. 10 showing the area over which the AC ground pad and n-type ohmic contact are capacitively coupled via the dielectric insulator layer and metal interconnect layer in accordance with an exemplary embodiment of the present invention.

The integrated capacitors that comprise the current invention are fabricated out of existing process elements in the following manner. With reference to FIGS. 10 and 11, additional interconnect metal regions 186(*a*), 186(*b*) may be formed adjacent the passivation layer 170 so as to overlap the n-type ohmic contacts. The overlap 190 of the metal interconnect 180 with the dielectric passivation layer 170 and the n-ohmic contact 156, (having not etched vias in this area) form integrated capacitors.

Figure 12:
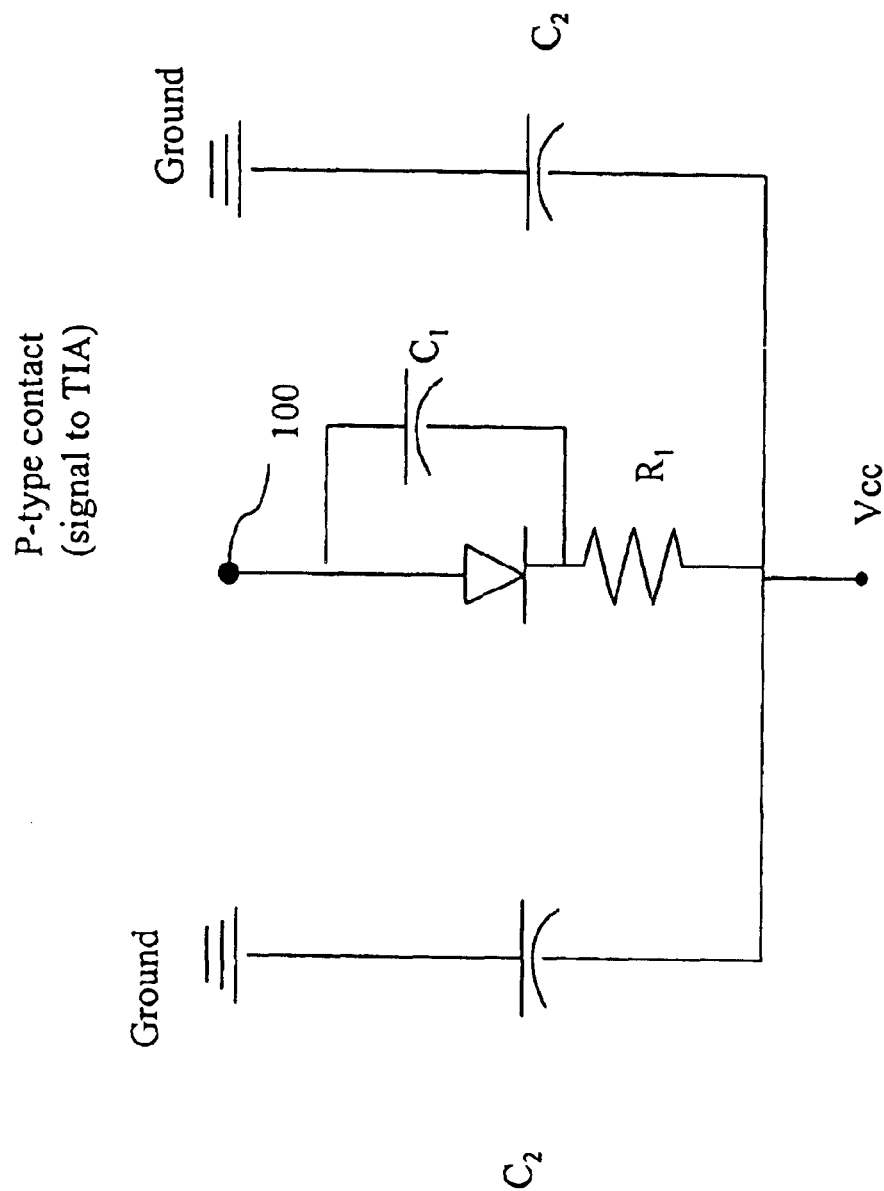
FIG. 12 is a simplified circuit diagram of the photodiode of FIG. 11 in accordance with an exemplary embodiment of the present invention.

The chip level circuit thus formed is shown in the simplified circuit diagram of FIG. 12. The photodetector may be modeled as an ideal diode with an RC time constant determined as a function of the series resistor $R_1$ and the parallel capacitor $C_1$. In accordance with an exemplary embodiment the return path capacitor $C_2$ is preferably at least an order of magnitude greater than the parallel capacitor $C_1$ (i.e. $C_2 > 10^* C_1$) associated with the photodiode. One of skill in the art will appreciate that the capacitance of the integrated capacitor(s) $C_2$ may be estimated in accordance with the thickness (d), free space permittivity ($\varepsilon_o$), relative permittivity ($\varepsilon_r$) of the passivation layer 170 and the total overlap area (A) 190 (see FIGS. 10 and 11) as follows:

$$C = \frac{\varepsilon_o \varepsilon_r A}{d}$$

The described exemplary embodiment provides a direct return path for the AC signal generated by the high speed photodetector, reducing the inductance associated with the return paths compared to typical applications according to prior art. In addition, the present invention enables on wafer scattering parameter measurements using conventional coplanar probe technology. Wafer level testing with coplanar probes leverages conventional characterization technology that allows the test apparatus to be calibrated out to the probe tips for highly accurate measurements.

In operation, a coplanar probe may be used in the normal ground-signal-ground configuration. However, when testing the described exemplary embodiment, the ground probes are only used as AC ground rather than both DC source ground and AC ground. A DC source may then be coupled to the n-type ohmic contact using a non-critical DC probe to provide the bias needed for operation of the PIN during test.

Therefore the present invention provides means for accurately measuring scattering parameter data that may be analyzed to explicitly solve for electrical parameters such as the capacitance and series resistance of the device under test. Further, the p-type and n-type ohmic contacts are physically separated in a coaxial layout to provide reduced capacitance therebetween.

One of skill in the art will appreciate that the present invention is not limited to the two capacitor design illustrated in the exemplary layout of FIG. 11 and circuit diagram of FIG. 12. Rather the present invention may be utilized with a variety of embodiments such as for example a single capacitor design, or a design comprising a plurality of three or more capacitors formed in accordance with the same process and layout techniques described herein. However, the described exemplary two capacitor layout has the advantage of being compatible with the use of conventional ground-signal-ground coplanar probes.

Further, the present invention is not limited to integrated capacitors formed from metal conductors. Rather, such conductors may include not only metals but semiconductor surfaces or other conductive materials as well. In addition the present invention is not limited to a particular insulator material. Rather a variety of insulators such as, for example, silicon nitride, silicon dioxide, silicon oxynitride, strontium or barium fluorides, barium strontium titanate, other inorganic dielectrics, organic dielectrics such as BCB or the polyimides, and other materials known in the art may be used in the formation of the described exemplary integrated capacitor.

Figure 13:
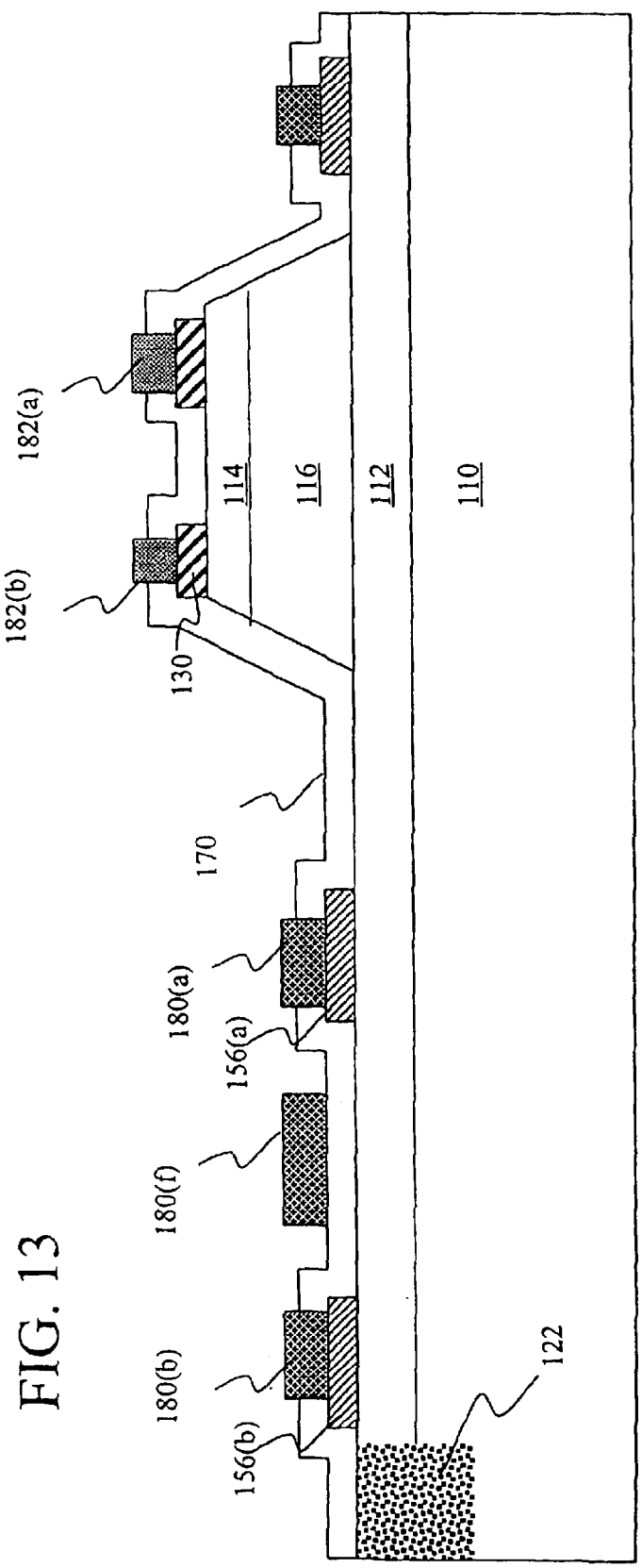
FIG. 13 is a cross section view of a photodetector having an integrated capacitor having an electrode formed from a semiconductor surface in accordance with an exemplary embodiment of the present invention.
Figure 14:
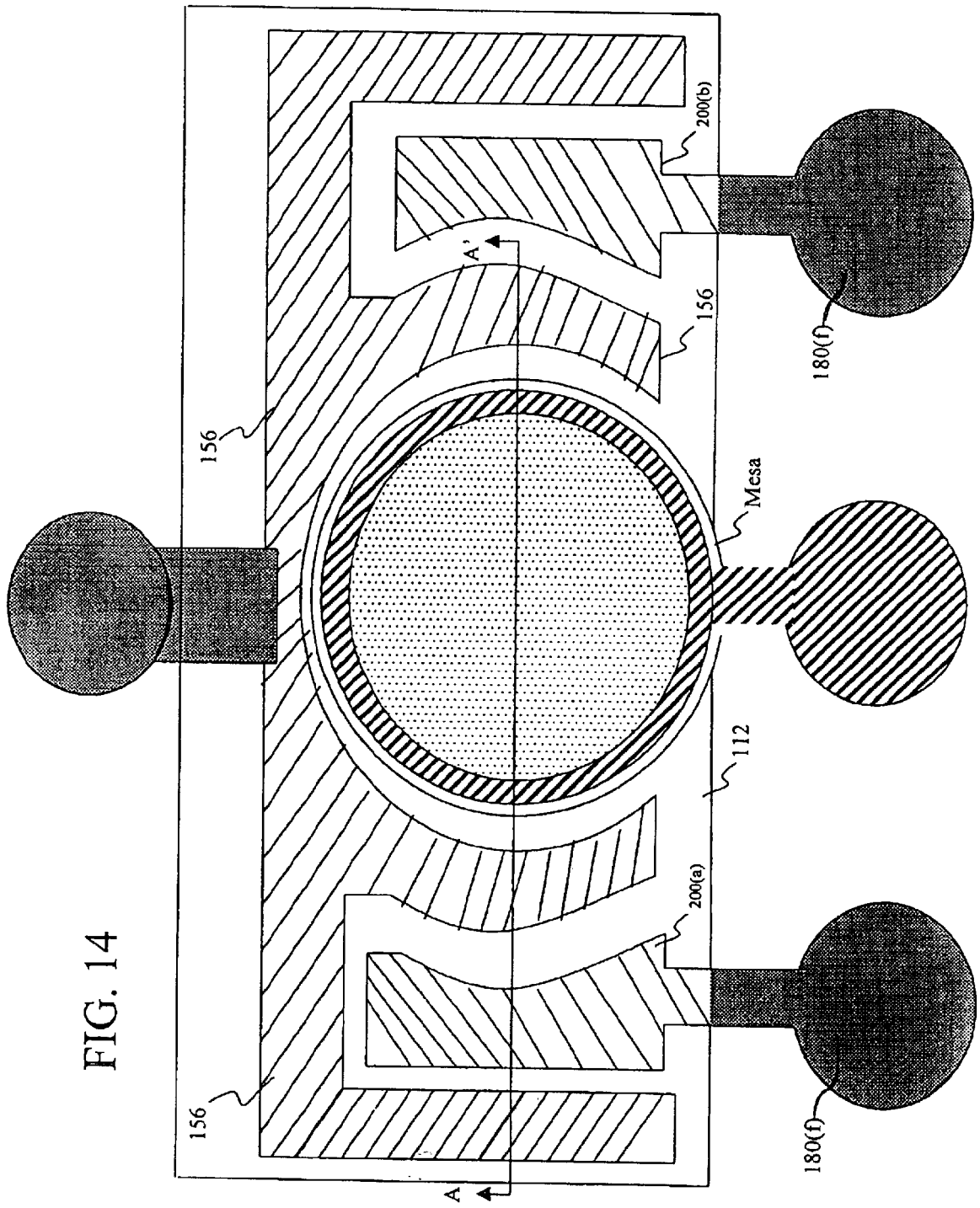
FIG. 14 is a plan view of a photodetector having an integrated capacitor having an electrode formed from a semiconductor surface as illustrated in cross section in FIG. 13, in accordance with an exemplary embodiment of the present invention.

For example, an exemplary embodiment of the present invention that utilizes a semiconductor surface as one of the capacitor electrodes is illustrated in cross section AA of FIG. 13, and the plan view of FIG. 14. In this embodiment the photodetector may again comprise for example, a PIN photodiode comprising an intrinsic layer 116 formed between the lower n-type layer 112 and the upper p-type layer 114. In an exemplary embodiment of the present invention, the PIN photodetector may again be formed on a semi-insulating substrate 110 formed from gallium arsenide or other semi-insulating materials known in the art.

This embodiment again utilizes what is referred to as a 'mesa' process wherein a photodiode detector 'mesa' is formed in a region of the epitaxial layers. In this embodiment the upper p-type and intrinsic layers are etched away everywhere except for the detector region. The mesa etch exposes a large area of the lower n-type layer that extends circumferentially to surround the mesa. The mesa etch allows a large contact area to be made between the lower n-type layer 112 and the metal interconnect layers 180(*a*) and 180(*b*), by way of the n-type ohmic contacts 156(*a*) and 156(*b*).

In this embodiment the lower conductive region of the photodiode (n-type layer 112 in this embodiment) extends laterally from the bottom of the detector and is limited by an isolating implant 122. In an area adjacent to the photodiode, the conductive part of this region is covered with an appropriate dielectric, such as for example a passivation layer 170. In this embodiment a metal interconnect layer 180(*f*) may also be formed on a portion of the passivation layer so that the metal interconnect layer 180(*f*) is capacitively coupled to the n-type layer 112.

Referring to the plan view of FIG. 14, the integrated capacitors that comprise the current invention are formed by the overlap 200(*a*) and 200(*b*) of the metal interconnect 180(*f*) with the passivation layer and the n-type layer 112. The capacitance value will again depend on the dielectric constant and thickness of the dielectric passivation layer as well as the layout of overlap areas 200(*a*) and 200(*b*).

One of skill in the art will appreciate that low electrical resistance between the photodetector and the AC grounds tends to promote the return current path from the photodetector through the AC grounds rather than through the bias terminal. In practice the sheet resistivity of semiconductor layers (which may be calculated as the product of the density of charge carriers and the fundamental electronic charge, divided by the thickness of the layer and the carriers' mobility) is typically on the order of ohms per square or higher. In these instances it may be desirable to reduce the resistance between the photodetector and the capacitor plate and within the capacitor plate.

Therefore, in the described exemplary embodiment, low resistivity contact metal 156 (typically a fraction of an ohm per square) may be formed around the capacitor area to reduce the resistance between the photodetector and the capacitor plate. One of skill in the art will further appreciate that the net resistance to the capacitor plate may also be reduced by extensively routing contact metal over the semiconductor area.

Figure 15:
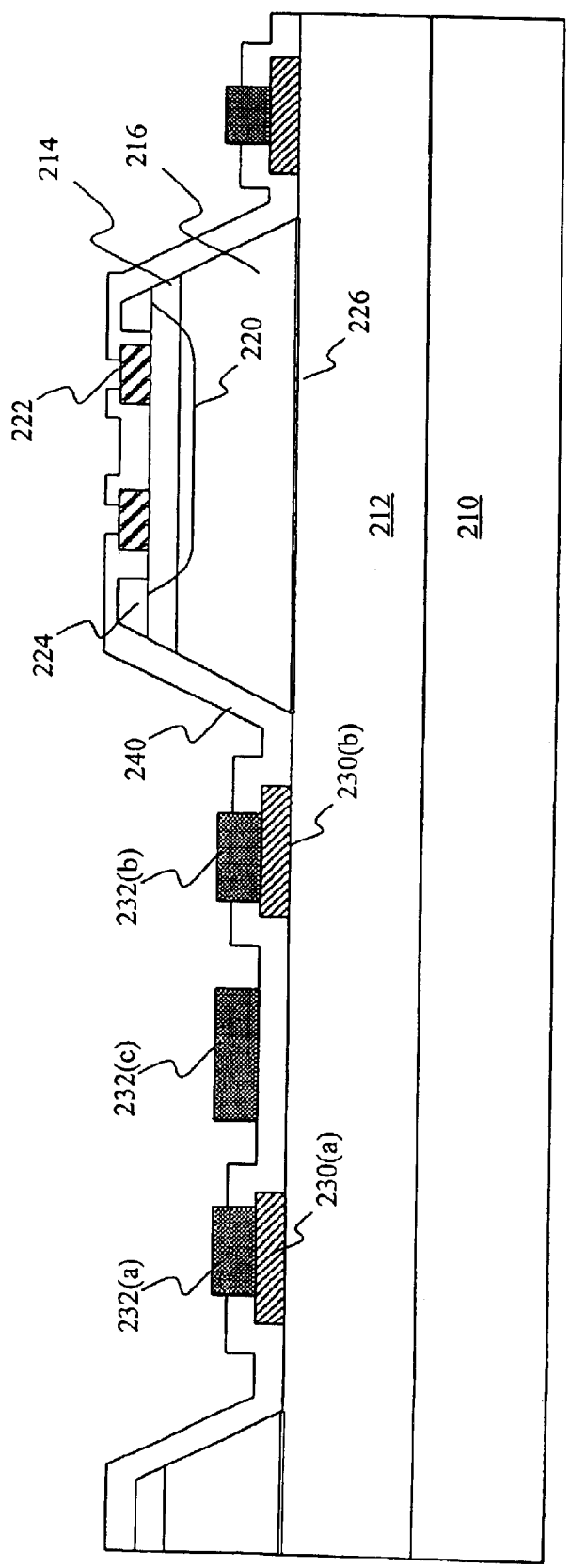
FIG. 15 is a cross section of a diffused photodetector formed on a semi-insulating substrate having an integrated capacitor in accordance with an exemplary embodiment of the present invention.

The utilization of a semiconductor surface as one of the electrodes of an integrated capacitor may also be adapted for forming capacitors in photodiodes that have one of the detector terminals diffused into the wafer surface, in accordance with well known 'planar' processing techniques. Such an embodiment is illustrated in cross-section A—A of FIG. 15 and the plan view of FIG. 16. In the described exemplary embodiment, a lower n-type layer 212, an undoped absorbing layer 216 and an n-type isolation layer 214 may be formed on a semi-insulating substrate 210. In the described exemplary embodiment, an anode may be formed by a p-type diffusion 220 into the n-type contact layer 214 and the formation of an appropriate p-type ohmic contact 222 within the diffused region 220.

In accordance with an exemplary embodiment, a diffusion mask 224 may be used to define the diffusion area. In addition, the diffusion parameters may be controlled, as is known in the art, to ensure that the diffusion stops just past the interface between the upper n-type isolation layer 214 and the undoped absorbing layer 216 that serves as the light absorbing medium. In this embodiment the lower n-type layer 212 functions as the photodiode cathode while providing lateral access for contact metallization.

In this configuration, individual devices may be defined by etching the overlying absorbing layer 216 and n-type isolation layer 214 in the region where it is desired to form capacitors. The etch step may involve the use of an etch stop layer 226, as will be obvious to one skilled in the art. The etch exposes a large area of the lower n-type layer 212 that extends circumferentially to surround the mesa. The etch allows a large contact area to be made between the lower n-type layer 212 and metal interconnect layers 230(*a*) and 230(*b*), by way of n-type ohmic contacts 232(*a*) and 232(*b*), respectively.

In an area adjacent to the photodiode, the lower n-type layer 212 is covered with an appropriate dielectric layer 240, such as for example a passivation layer. In this embodiment a metal interconnect layer 232(*c*) may also be formed on a portion of the dielectric layer 240. Thus in the described exemplary embodiment the metal interconnect layer 232(*c*) is capacitively coupled to n-type layer 212.

Figure 16:
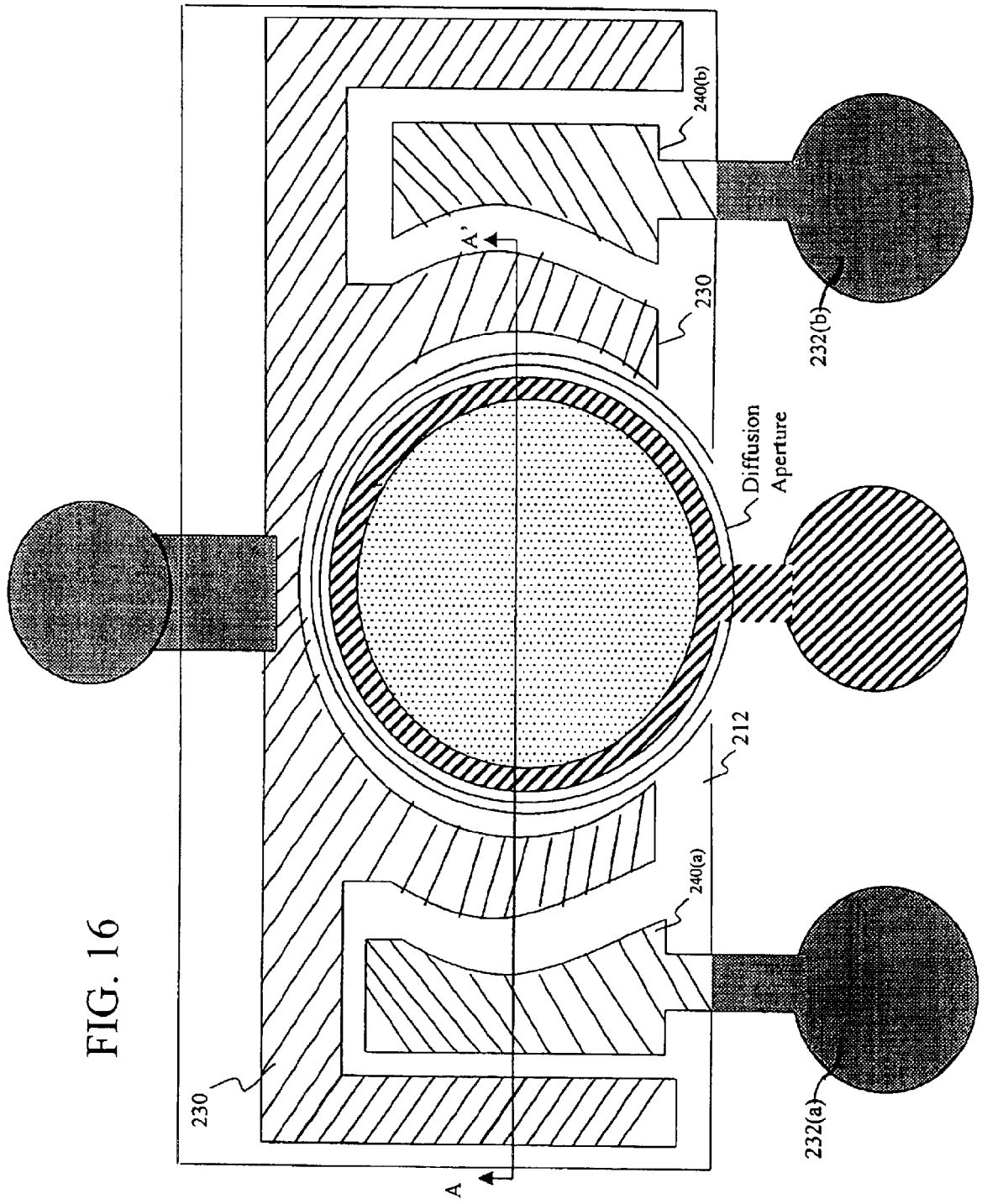
FIG. 16 is a plan view of the diffused photodetector illustrated in FIG. 15 in accordance with an exemplary embodiment of the present invention.

Referring to the plan view of FIG. 16, the integrated capacitors that comprise the current invention are formed by the overlap 240(*a*) and 240(*b*) of the metal interconnect 232(*c*) with the dielectric layer 240 (see FIG. 15) and the lower n-type layer 212. The capacitance value will again depend on the dielectric constant and thickness of the dielectric layer as well as the layout of overlap areas 240(*a*) and 240(*b*). As previously described contact metalization 230 may be used to reduce the electrical resistance between the device cathode and the lower plate of the capacitor.

Figure 17:
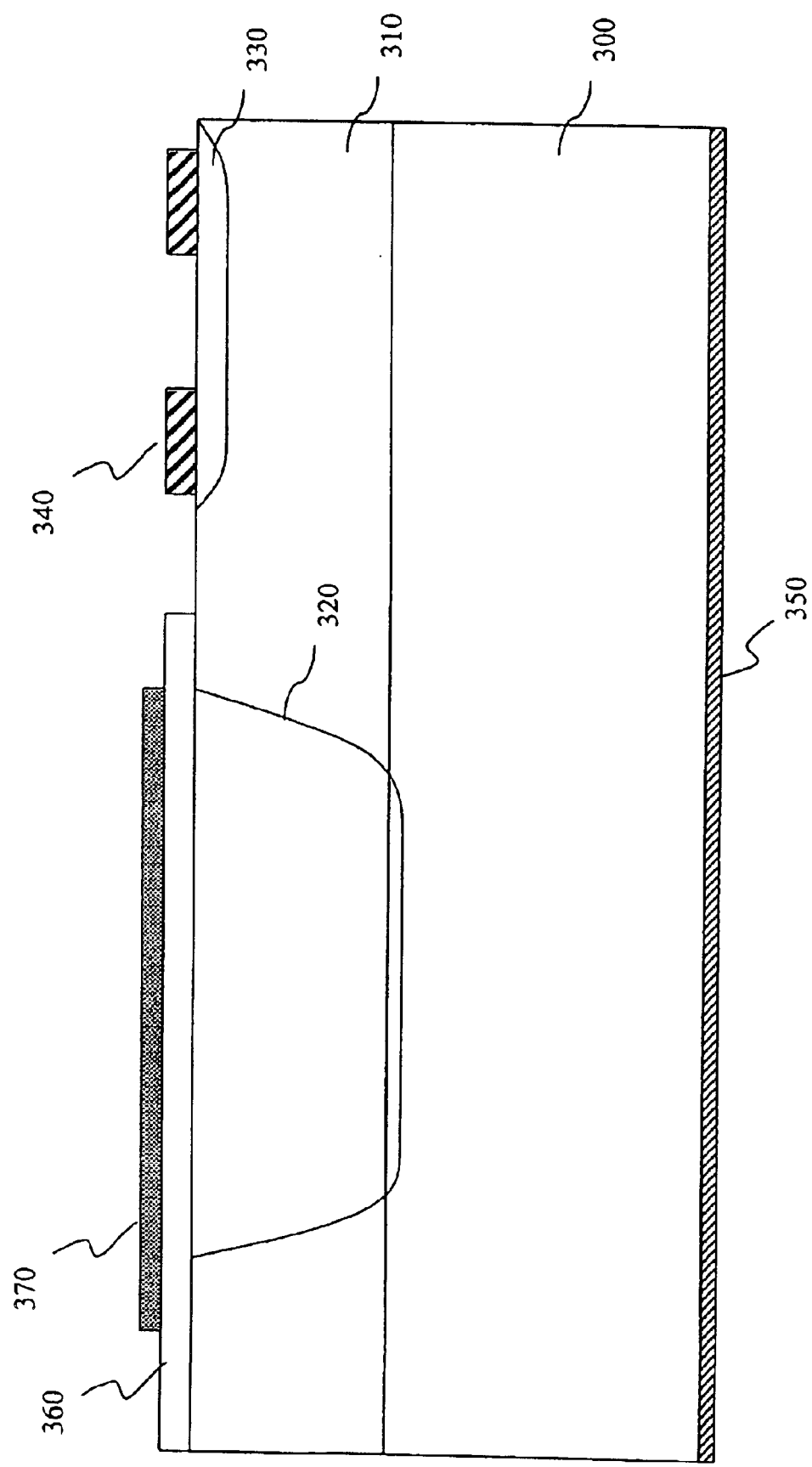
FIG. 17 is a cross section of a photodetector having a diffused contact and an integrated capacitor formed on a bulk doped substrate in accordance with an exemplary embodiment of the present invention.

The present invention may also be utilized with a photodetector that is electrically contacted on the backside of the substrate. For example, FIG. 17 is a cross section of a photodetector having an intrinsic layer 310 formed on an n-type substrate 300. As is known in the art an n-type well 320 may be defined in the intrinsic layer by diffusing an n-type dopant, such as, for example, carbon, silicon, or the like (in a gallium arsenide based detector) through the intrinsic layer to contact the n-type substrate 300. In addition a p-type diffusion region 330 may also be formed in the intrinsic layer 310 by diffusing a suitable p-type dopant into the intrinsic layer to complete the p-n junction of the photodetector. In the described exemplary embodiment the p-type diffusion does not extend through the intrinsic layer and is isolated from the n-type substrate.

In this embodiment, an annular anode or p-type contact 340 defines the detector active area within the diffused p-type region 330. Further the backside of the substrate may be contacted with an n-type metalization to form the device cathode or n-type contact 350. In accordance with an exemplary embodiment, a dielectric layer 360 may be formed over a portion of the upper surface of the intrinsic layer including at least a portion of the n-type well 320. In this embodiment, a conductive layer 370 such as, for example, an interconnect metal layer, may be formed adjacent the dielectric layer 360. In this embodiment, an integrated capacitor is formed between the conductive layer 370, the dielectric layer 360, the n-type well 320, the n-type substrate 300 and the cathode 350 on the backside of the substrate 300.

Figure 18:
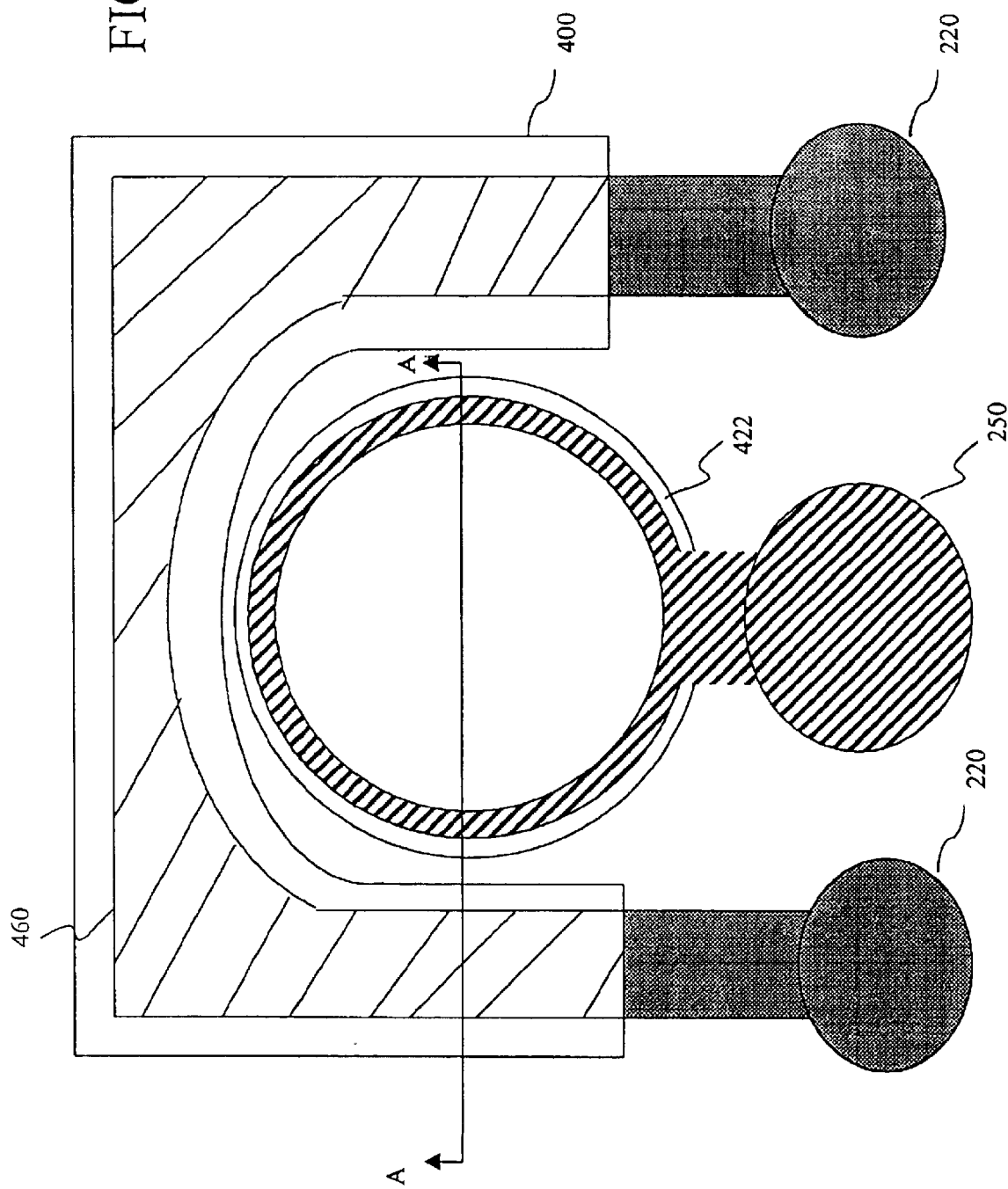
FIG. 18 is a plan view of a photodetector having an integrated capacitor formed on a semiconductor surface when the substrate is one of the terminals in accordance with an exemplary embodiment of the present invention.
Figure 19:
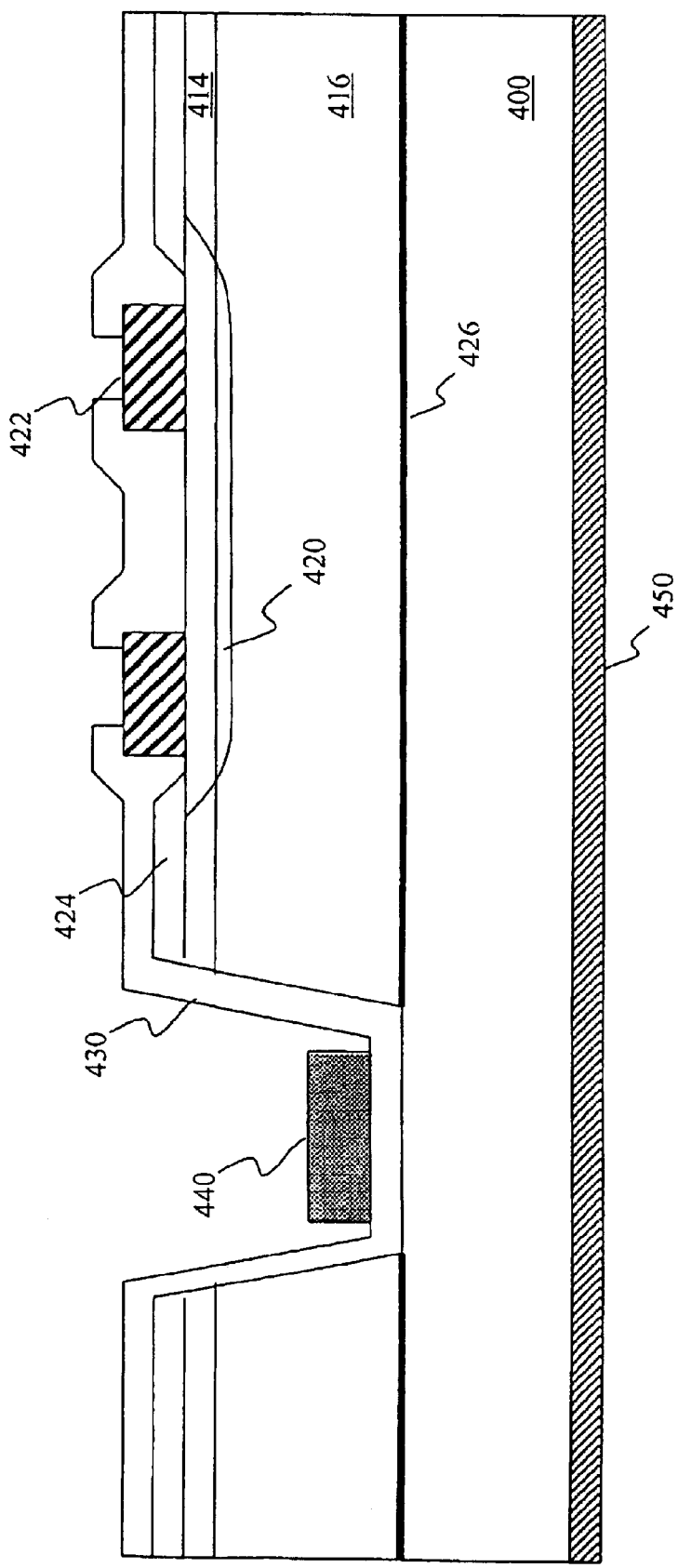
FIG. 19 is a cross section of the photodetector illustrated in plan view in FIG. 18 in accordance with an exemplary embodiment of the present invention.

An alternative process for forming capacitors on a semiconductor surface when the substrate is one of the terminals, is illustrated in FIG. 18 (plan view) and FIG. 19 (cross section A—A shown in FIG. 18 plan view). In this embodiment an undoped absorbing layer 416 and an n-type isolation layer 414 may be formed on a conductive semiconductor substrate 400. In this embodiment the substrate may be doped with a suitable n-type dopant.

In the described exemplary embodiment, the anode may again be formed by a p-type diffusion 420 into the n-type isolation layer 414 and the formation of an appropriate p-type ohmic contact 422 within the diffused region. In accordance with an exemplary embodiment, a diffusion mask 424 may be used to define the diffusion area. The individual elements may again be defined by etching the overlying absorbing layer 416 and n-type isolation layer 414 in the region where it is desired to form capacitors. The etch step may again involve the use of an etch stop layer 426. The etch exposes an area of n-type doped semiconductor substrate 400 that extends circumferentially to surround the mesa.

In an area adjacent to the photodiode, the upper surface of the conductive semiconductor substrate 400 is covered with an appropriate dielectric layer 430, such as for example a passivation layer. In this embodiment a conductive layer 440 may be formed on a portion of the dielectric layer. Thus in the described exemplary embodiment the conductive layer 440 is capacitively coupled to a cathode 450 deposited on a lower surface of the conductive semiconductor substrate 400.

Referring to the plan view of FIG. 18, the integrated capacitors that comprise the current invention are formed by the overlap 460 of the conductive layer 440 with the dielectric layer 430 (see FIG. 19) and the conductive semiconductor substrate 400. The capacitance value will again depend on the dielectric constant and thickness of the dielectric layer as well as the layout of overlap area 460. Advantageously, when the entire substrate is conductive, the resistance between the detector cathode and adjacent capacitor terminals may be low enough that use of contact metals to reduce resistance in series with the capacitors may not be required.

Figure 20:
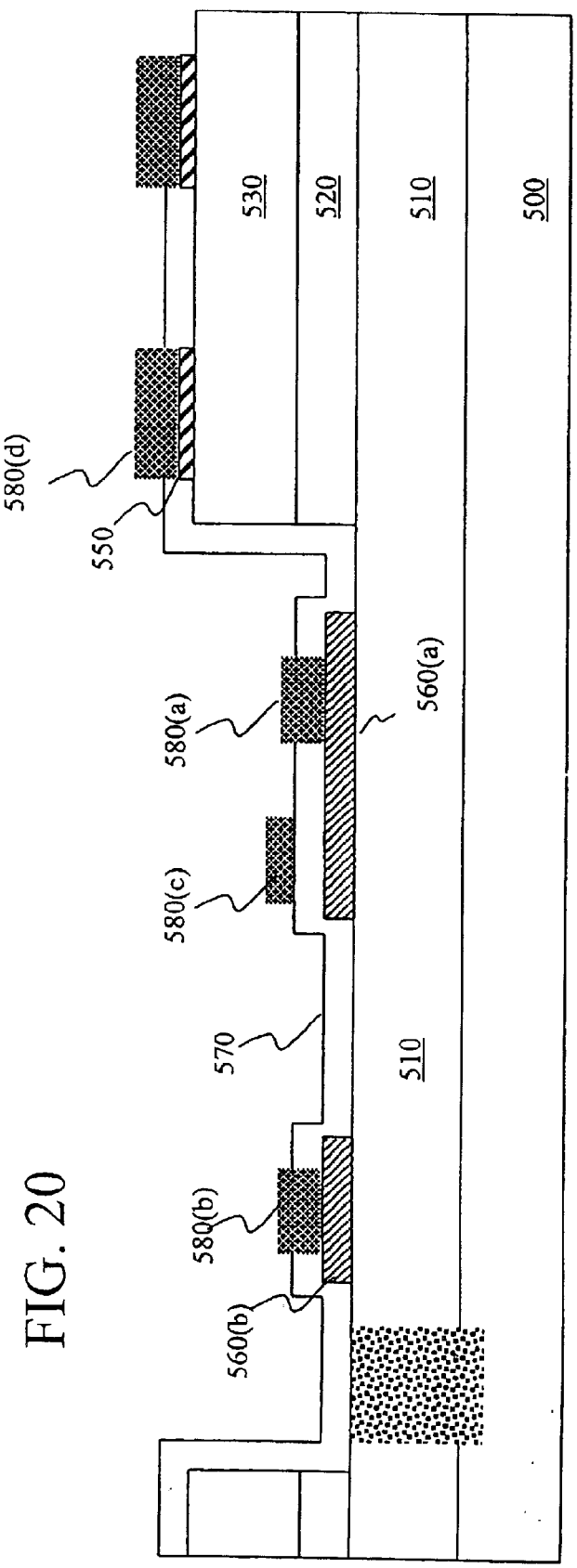
FIG. 20 is a cross section of a photodetector having an integrated capacitor and a monolithically formed bias resistor in accordance with an exemplary embodiment of the present invention.

Further circuit advantages may be realized by the implementation of a resistor, between the bias terminal of the detector chip, and the detector cathode(s). In the described exemplary embodiment a bias resistor may be monolithically formed on a photodetector as illustrated in the cross-section of FIG. 20. In accordance with an exemplary embodiment the photodetector may comprise a lower n-type layer 510, an intrinsic layer 520 and an upper p-type layer 530 formed on a semi-insulating substrate 500. One of skill in the art will appreciate that the orientation and type of materials forming the photodetector may be varied depending on the design. Therefore, the disclosed photodetector is by way of example and not by way of limitation.

The active area of the device may be defined by a mesa structure having an annular anode or p-type contact 550 deposited on the upper surface of the p-type layer 530. In the described exemplary embodiment, an annular cathode n-type ohmic contact 560 may be formed on a portion of the exposed n-type layer 510. A cathode or n-type ohmic contact 560 may be formed from, for example, AuGe/Ni/Ge deposited by electron beam evaporation or sputtering.

In accordance with an exemplary embodiment the cathode or n-type ohmic contact 560(*a*) may form a ring extending circumferentially around the mesa structure and in electrical contact with the lower n-type layer 510. In accordance with an exemplary embodiment, the cathode or n-type ohmic contact 560(*a*) is brought out over a relatively large area of the wafer.

After the anode and cathode are formed and patterned, a dielectric layer 570, such as for example a passivation layer is deposited. The passivation layer 570 is chosen to be transmissive to light at the desired wavelength. As previously described, interconnect metal layer 580(*a*) and 580(*b*) may be formed and patterned to provide low resistance contacts to the anode and cathode. Concurrently with the formation of n-type ohmic contact 560(*a*) and interconnect metals 580(*a*) and 580(*b*) are formed n-type ohmic contact 560(*b*) and interconnect metals 580(*c*). In the described exemplary embodiment the overlap of the metal interconnect 580(*c*) with the dielectric coating 570 and the n-type layer 510 or n-type ohmic contact 560(*a*) forms the on chip capacitor.

Further, the n-type layer 510 forms a resistive connection between the diode region (under intrinsic layer 520) and the terminal formed by n-type ohmic contact 560(*a*) and interconnect metal 580(*a*). One skilled in the art will appreciate that the value of the resistor thus formed may be varied in accordance with the resistivity of the n-type layer 510 and the layout geometry of this region. Also, n-type layer 510 can be implanted to increase the resistivity of this region without rendering it fully insulating. This may enable the formation of a high value resistor in a small amount of layout area.

Figure 21:
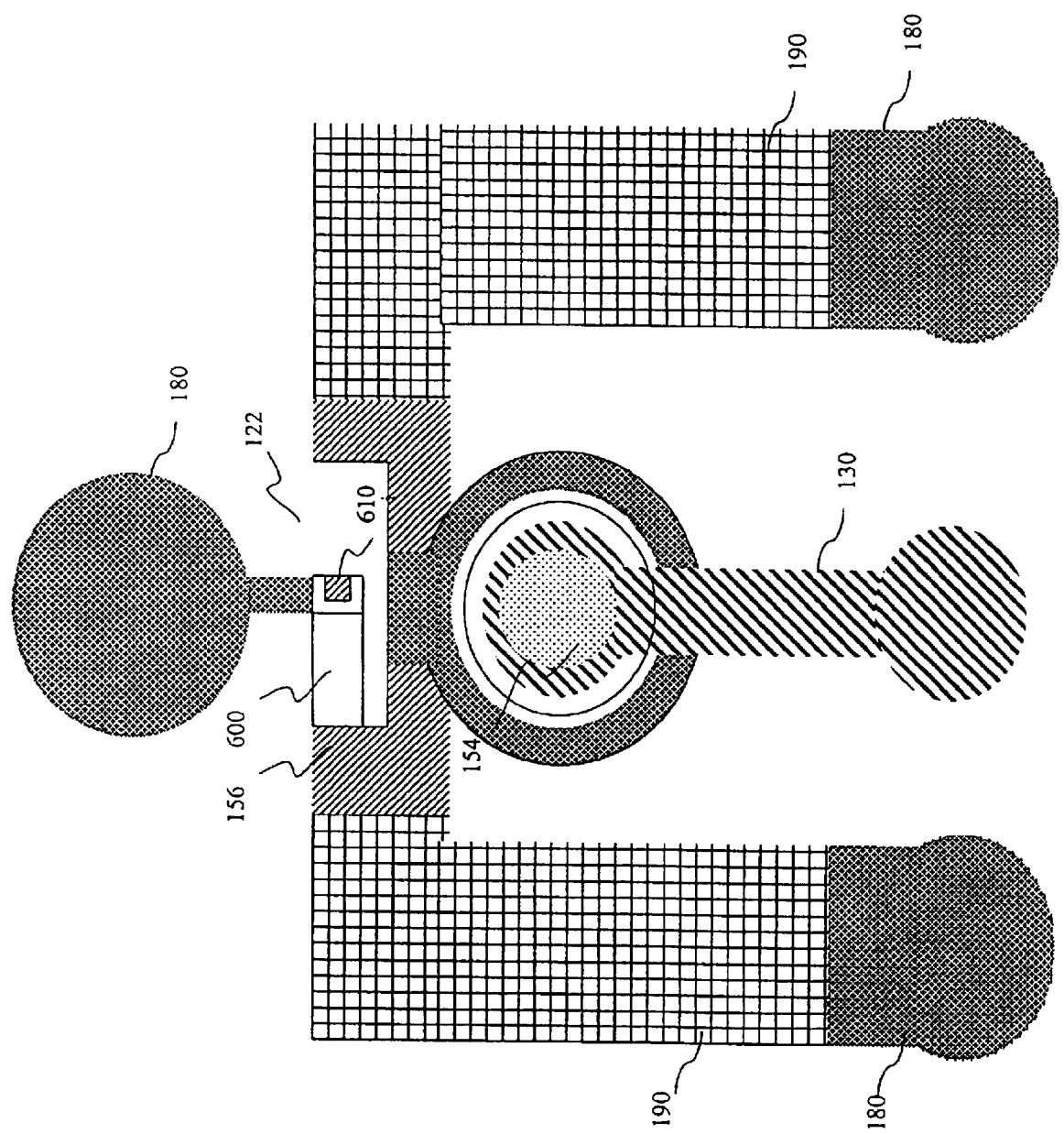
FIG. 21 is a plan view of FIG. 20 photodetector having a bias resistor formed in an otherwise electrically isolated region in accordance with an exemplary embodiment of the present invention.

Referring to the planview of FIG. 21 a bias resistor may be formed in an otherwise electrically isolated region 600 created in for example a PIN structure as previously described in FIGS. 10 and 11. In one embodiment an implant may be performed to create the isolation region 600. In this instance, an area of the n-type contact layer (region 112 of cross section FIG. 10, not shown in FIG. 21) may be masked prior to implantation to provide a non-implanted region within the otherwise implanted region 122, thus forming a piece of semiconductor material suitable for use as a bias resistor. Subsequent metalization of a portion 610 of this non-implanted area 600 forms connections to the bias resistor through the n-type ohmic contact layer 156 and interconnect metal layer 180. The bias resistor is therefore laterally isolated by the implant and vertically isolated by the semi-insulating substrate.

One of skill in the art will appreciate that the described present invention is not limited to photodetectors that utilize an isolation implant to define the bias resistor. For instance such a resistor may be formed by proper isolation of and connection to any conductor or semiconductor material that already exists in a given fabrication process, such as epitaxial layers, diffused layers, or any of the metallization layers.

Figure 22:
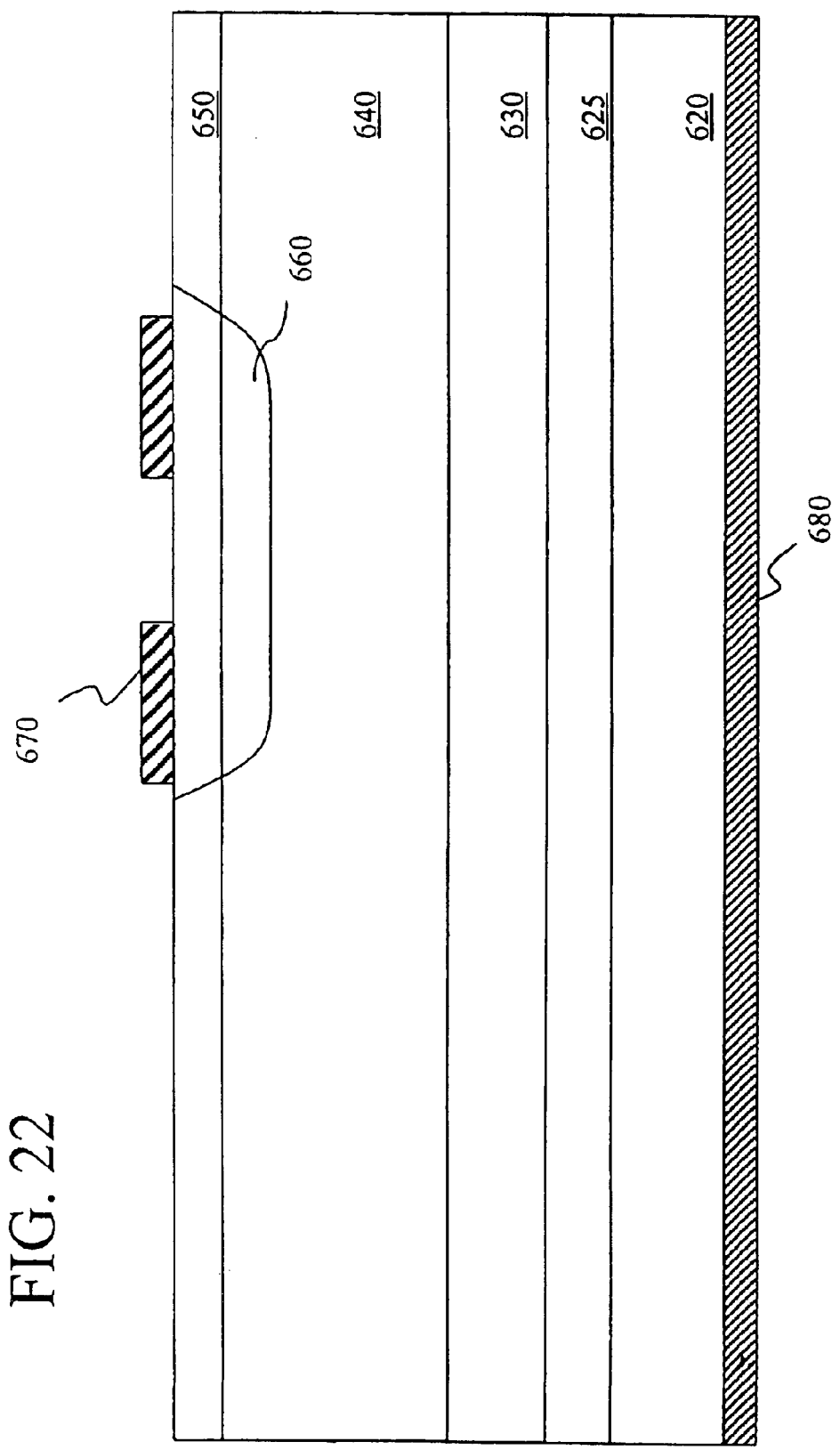
FIG. 22 is a cross section of a photodetector having a bias resistor formed through a high resistance epitaxial layer in accordance with an exemplary embodiment of the present invention.

For example, an exemplary embodiment using an epitaxial layer to form an integrated resistor is illustrated in FIG. 22. In this embodiment, a vertical resistor may be integrated into a diffused anode structure for use with an integrated capacitor as described with respect to FIG. 19. In this embodiment, a lightly doped, high resistivity layer 625 is formed adjacent a bulk doped substrate 620, followed by a highly doped n-type layer 630. In the described alternate embodiment an absorbing layer 640 may be formed on the highly doped n-type layer 630 followed by a heavily doped n-type isolation layer 650.

An anode may again be formed by a p-type diffusion 660 through the n-type isolation layer 650 and the formation of an appropriate p-type ohmic contact 670 within the diffused region 660. The p-type diffusion 660 penetrates into the intrinsic layer 640 to complete the p-n junction of the photodetector. In the described exemplary embodiment the p-type diffusion does not extend through the intrinsic layer and is isolated from the n-type substrate 620 as previously described with respect to FIG. 19. In the alternate embodiment, the doping level and thickness of the high resistivity layer 625 may be selected and controlled to produce a desired resistance between an n-type backside ohmic contact 680 and the highly doped n-type layer 630.

Figure 23:
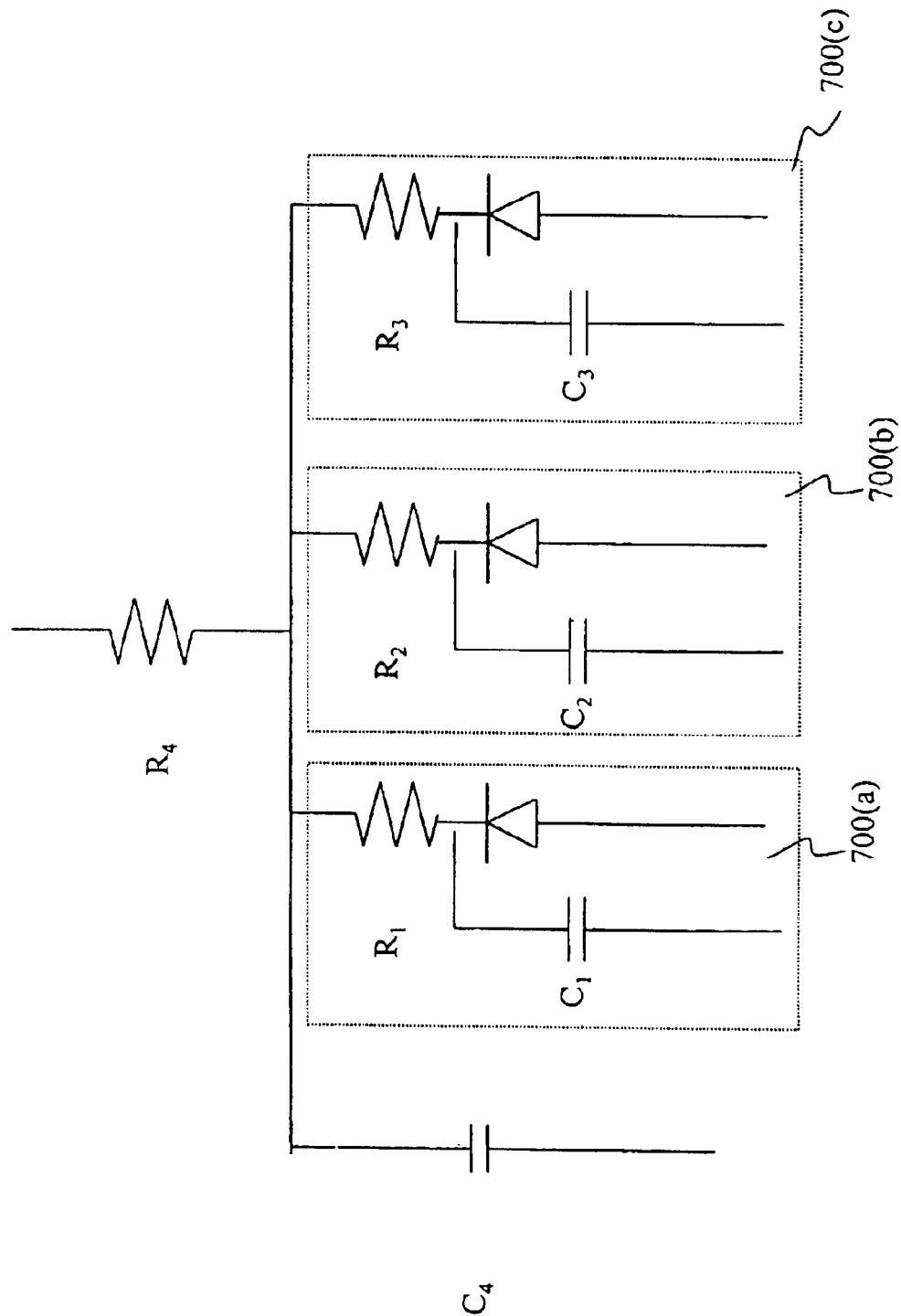
FIG. 23 is a simplified circuit diagram of an array of photodetectors illustrating the integration of various bias resistors and capacitors in accordance with an exemplary embodiment of the present invention.

One of ordinary skill in the art will appreciate that a variety of combinations of capacitor and bias resistor designs may be useful especially in the area of receiver array design. Referring to FIG. 23, a single integrated capacitor $C_4$ and or resistor $R_4$ may be utilized to serve an entire array, instead of or in addition to capacitors $C_1$, $C_2$, $C_3$ and or resistors $R_1$, $R_2$, $R_3$ included in the repeating elements 700(*a*), 700(*b*) and 700(*c*) of the array.

Figure 24:
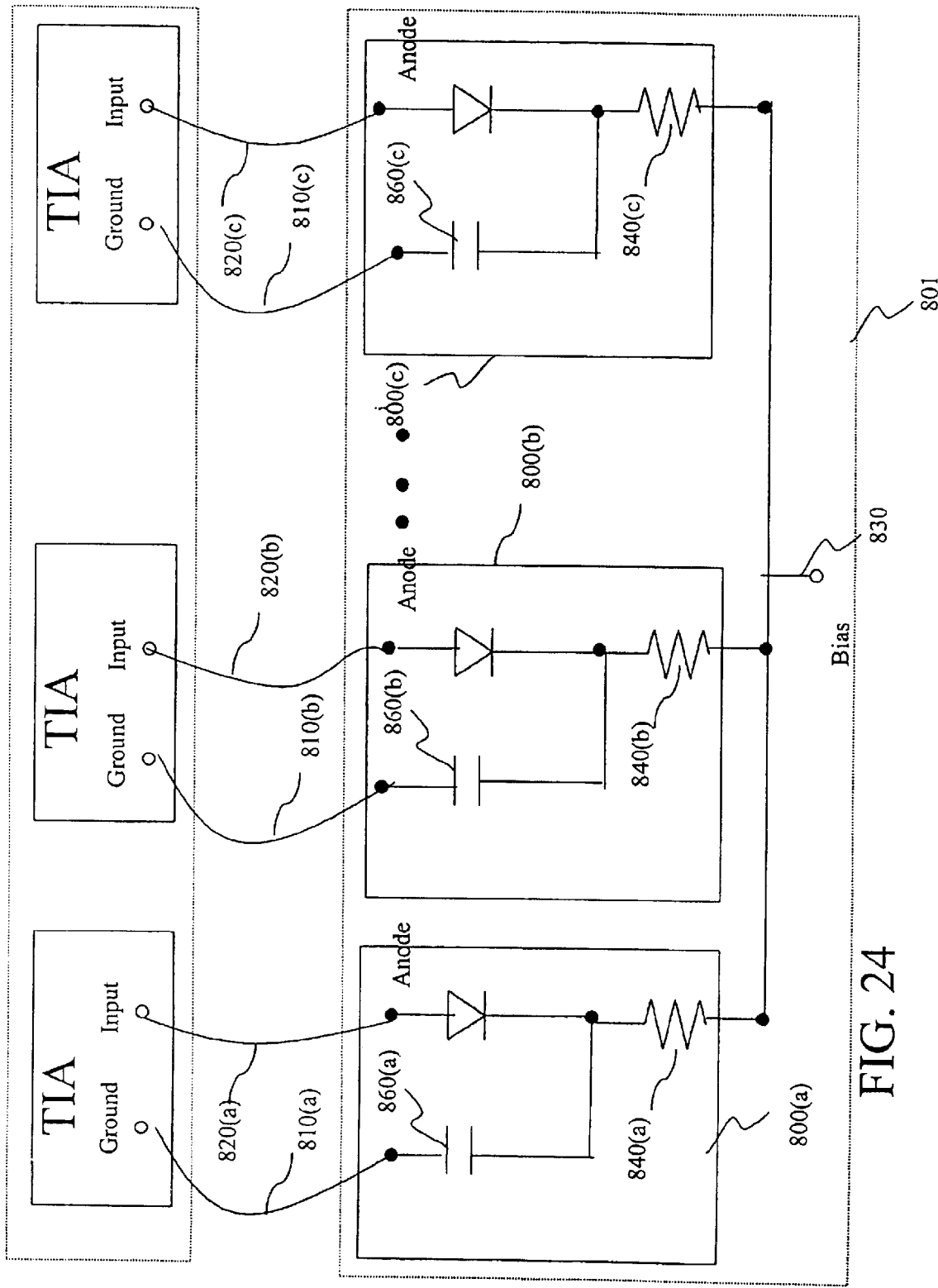
FIG. 24 is a simplified circuit diagram of an array of photodetectors wherein two or more of the photodetectors have an integrated capacitor and bias resistor and share a common bias line in accordance with an exemplary embodiment of the present invention, which are then connected to an array of transimpedance amplifiers.

In addition, referring to FIG. 24, the described exemplary embodiment may be utilized to reduce cross talk between individual photodetectors 800(*a*), 800(*b*) 800(*c*) etc. formed into a monolithic photodetector array 801. The described exemplary embodiment integrates parallel ground lines 810 (*a*), 810(*b*) and 810(*c*) between adjacent signal traces 820 (*a*), 820(*b*) and 820(*c*) respectively. Further, in accordance with an exemplary embodiment an array of photodetectors having integrated capacitors may utilize a common bias terminal 830. In the described exemplary embodiment, bias resistors 840(*a*), 840(*b*) and 840(*c*) may be integrated onto each of the photodetectors between the photodetector cathode 850(*a*), 850(*b*) and 850(*c*) and the common bias 830. The bias resistors isolate the AC return signal of each photodetector by blocking AC signals from propagating up the DC bias line.

In the described exemplary embodiment the bias resistors may be in the range of about 100–500 ohms to force AC signals to propagate down the return loop through the on chip capacitors 860(*a*), 860(*b*) and 860(*c*) to ground on their respective TIAs. The bias resistors therefore, substantially reduce the introduction of AC signals on the common bias line 830 that would otherwise be injected as noise onto the outputs of adjacent photodetectors.

One of skill in the art will further appreciate that the present invention is not limited to optical receivers. Rather, the present invention is equally applicable to transceivers. For example, the present invention may be integrated into an exemplary monolithic transceiver having closely-spaced but independently operable opto-electronic devices as illustrated in commonly owned, co-pending U.S. patent application Ser. No. 09/348,353, filed Jul. 7, 1999, the content of which is incorporated herein by reference as if set forth in full.

Figure 25:
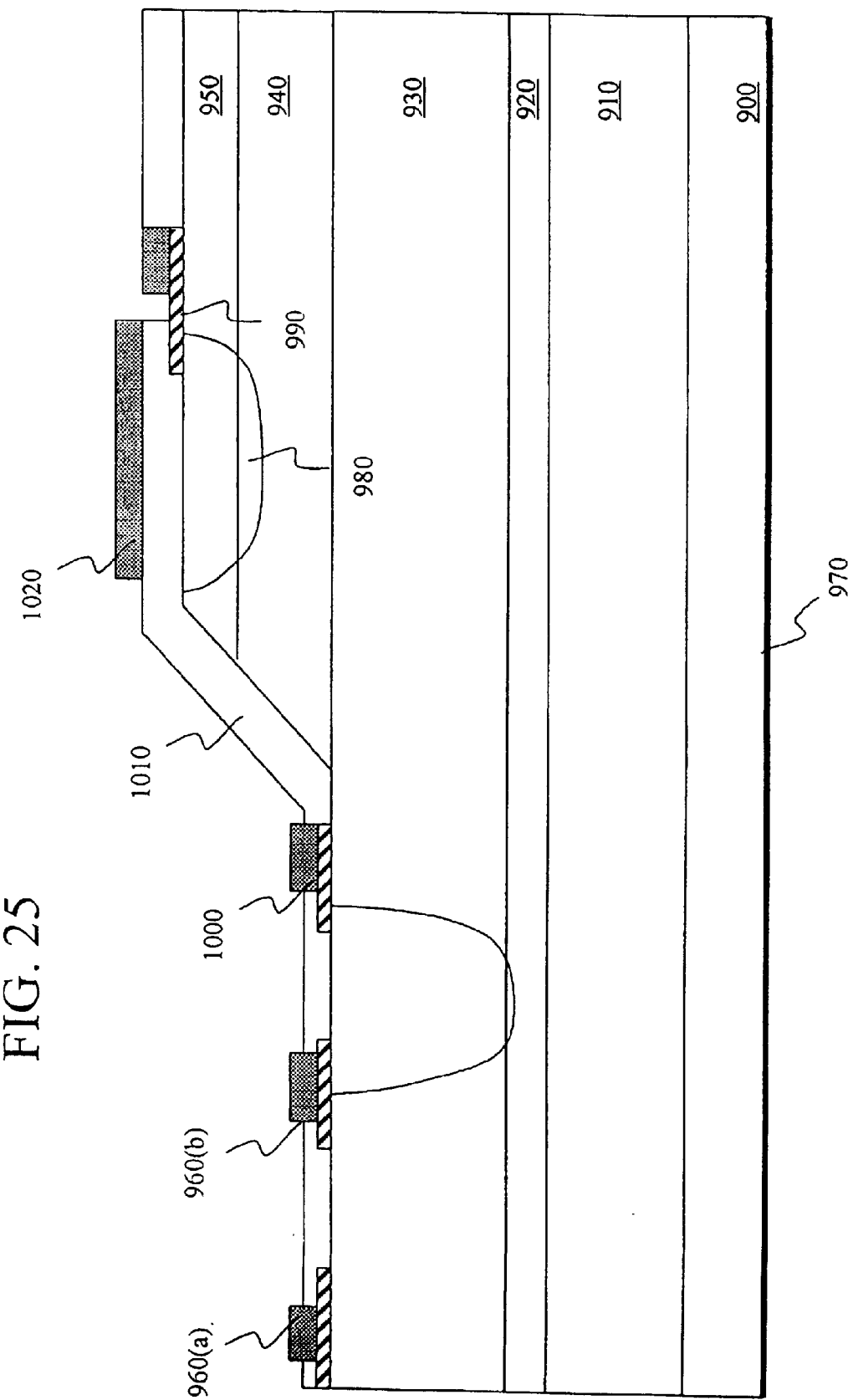
FIG. 25 is a cross section of an opto-electronic transceiver having a photodetector with an integrated capacitor monolithically formed on a common substrate with a vertical cavity surface-emitting laser in accordance with an exemplary embodiment of the present invention.

A cross section of an exemplary transceiver design is illustrated in FIG. 25. In the described exemplary transceiver embodiment, one or more VCSELs are formed using a known process for manufacturing such devices. The one or more VCSELs comprise an n-type GaAs substrate 900 and a first mirror 910 formed on the substrate 900. In the described exemplary embodiment the first mirror may comprise a well-known distributed Bragg reflector (DBR). In the described exemplary embodiment the first mirror is doped n-type. An optical cavity 920 is then formed adjacent the first mirror, the optical cavity comprising at least one quantum well layer or bulk layer. A second mirror 930 is formed on the optical cavity and doped to have p-type conductivity.

In accordance with an exemplary embodiment an intrinsic layer (i) 940 may be formed adjacent the p-type second mirror 930. The intrinsic layer may comprise, for example, undoped GaAs. In accordance with an exemplary embodiment an n-type layer 950, such as for example, AlGaAs, is formed adjacent the intrinsic layer 940. An etching process is then performed to etch away the extended n-type and intrinsic layers, 950 and 940 respectively, where the one or more VCSELs are to be formed leaving the photodetector mesa as shown in FIG. 25.

In accordance with an exemplary embodiment, annular anode contact 960(*a*) and 960(*b*) shown here with an interconnect metal layer, may be formed adjacent the p-type region to form an aperture for the VCSEL. A VCSEL cathode 970 contact may be formed on the backside of the substrate 900. In the described exemplary embodiment, a high resistivity implant region 980 may be formed around the photodetector to eliminate leakage current between the anode and cathode of the photodetector. In the described exemplary embodiment, an annular photodetector cathode 990 is formed adjacent the n-type region 950 of the photodetector and an anode 1000 is formed on the p-type region 930. In this embodiment an insulator layer 1010 may again be deposited on the mesa structure as well as on at least a portion of the photodetector cathode 990. A second conductive layer 1020 may then be formed over the insulator to provide the described exemplary integrated capacitor.

Figure 26:
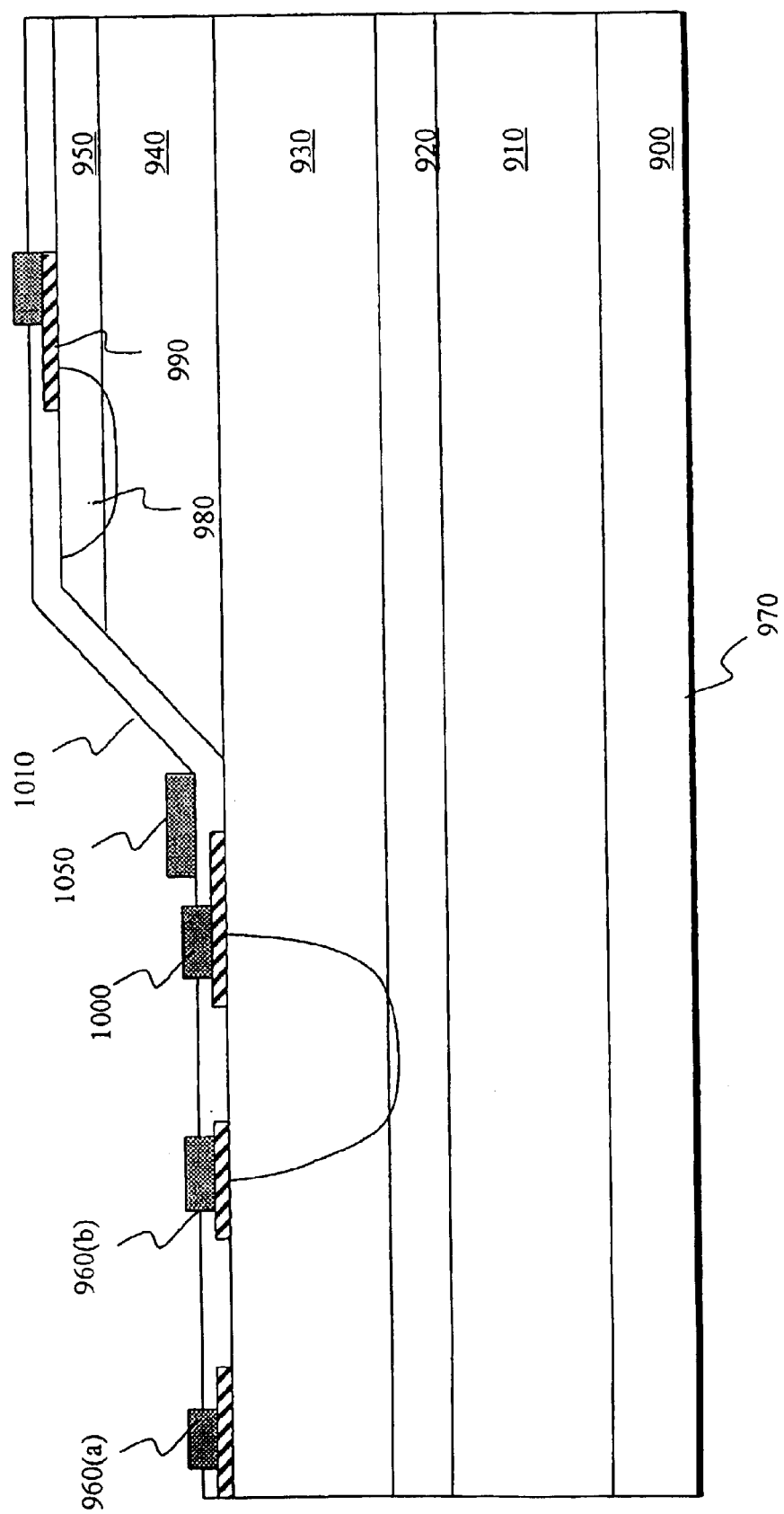
FIG. 26 is a cross section of an opto-electronic transceiver having a photodetector with an alternate integrated capacitor monolithically formed on a common substrate with a vertical cavity surface-emitting laser in accordance with an exemplary embodiment of the present invention.

Referring to FIG. 26, in an alternate embodiment the insulator layer 1010 may again be deposited on the mesa structure as well as on at least a portion of the photodetector anode 990, a second conductive layer 1050 may be formed over the insulator layer, overlapping a portion of the photodetector anode 990 to provide the described exemplary integrated capacitor.

Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. An optoelectronic device, comprising:
    a semiconductor substrate;
    a photodetector formed adjacent the semiconductor substrate, said photodetector including an AC ground terminal, and a bias terminal; and
    a capacitor formed adjacent the semiconductor substrate, wherein said capacitor is coupled between said photodetector AC ground terminal and said photodetector bias terminal, wherein a continuous constant bias is applied to said bias terminal.

2. The optoelectronic device of claim 1 wherein the capacitor comprises an insulator layer formed adjacent to a first electrode and a conductive layer formed adjacent to said insulator layer and overlapping a portion of said first electrode.

3. The optoelectronic device of claim 2 wherein the first electrode comprises a region of conductive semiconductor material.

4. The optoelectronic device of claim 2 wherein the first electrode comprises a metal layer.

5. The optoelectronic device of claim 2 wherein the insulator layer comprises a dielectric layer.

6. The optoelectronic device of claim 5 wherein the dielectric layer comprises silicon nitride.

7. The optoelectronic device of claim 5 wherein the dielectric layer comprises silicon dioxide.

8. The optoelectronic device of claim 5 wherein the dielectric layer comprises an organic dielectric.

9. The optoelectronic device of claim 5 wherein the dielectric layer comprises an inorganic dielectric.

10. The optoelectronic device of claim 2 wherein the insulator layer comprises silicon oxynitride.

11. The optoelectronic device of claim 2 wherein the photodetector comprises a metal-semiconductor-metal detector.

12. The optoelectronic device of claim 2 wherein the photodetector comprises an avalanche photodiode.

13. The optoelectronic device of claim 2 wherein the photodetector comprises a photodiode.

14. The optoelectronic device of claim 13 wherein said photodiode comprises: an intrinsic layer sandwiched between an n-type layer and a p-type layer.

15. The optoelectronic device of claim 14 wherein an isolating implant region is formed in a first portion of said n-type layer.

16. The optoelectronic device of claim 15 wherein said isolating implant region comprises a proton implant region.

17. The optoelectronic device of claim 15 wherein said first electrode comprises a photodetector n-type ohmic contact deposited adjacent said n-type layer, and wherein a second electrode overlaps at least a portion of said first electrode.

18. The optoelectronic device of claim 1 further comprising a bias resistor, wherein said bias resistor couples said photodetector to said bias terminal.

19. An optoelectronic device, comprising:
    a semiconductor substrate:
    an array of photodetectors formed adjacent the semiconductor substrate; and
    a single monolithic capacitor couples a plurality of said photodetectors to a single bias terminal, wherein a continuous constant bias is applied to said bias terminal.

20. The optoelectronic device of claim 19 further comprising one or more bias resistors, wherein said one or more bias resistors couple said one or more photodetectors to said bias terminal.

21. The optoelectronic device of claim 19 wherein a monolithic capacitor individually couples each of said one or more photodetectors to said single bias terminal.

22. The optoelectronic device of claim 19 further comprising a plurality of monolithic bias resistors, wherein a separate bias resistor is coupled between each of said one or more photodetectors and said single bias terminal.

23. The optoelectronic device of claim 19 further comprising a monolithic bias resistor coupled between said one or more photodetectors and said bias terminal.

24. The optoelectronic device of claim 19 wherein said capacitor comprises a dielectric layer formed adjacent to a first electrode and a conductive layer formed adjacent to said dielectric layer and overlapping a portion of said first electrode.

25. An optoelectronic device; comprising:
a multilayered vertical cavity surface emitting laser (VCSEL) formed on a substrate, said VCSEL including a first mirror formed adjacent the substrate, an active region formed adjacent the first mirror, and an second mirror adjacent the active region;
a photodetector formed laterally adjacent to said VCSEL substrate, said photodetector including an AC ground terminal and a bias terminal; and
a capacitor formed on a surface of said photodetector, wherein said capacitor is coupled between said photodetector AC ground terminal and a said photodetector bias terminal.

26. The optoelectronic device of claim 25 wherein the capacitor comprises a dielectric layer formed adjacent to a first portion of a first electrode and conductive layer formed adjacent to said dielectric layer and overlapping a second portion of said first electrode.

27. The optoelectronic device of claim 25 wherein the photodetector comprises a photodiode.

28. The optoelectronic device of calm 25 wherein the photodetector comprises a metal-semiconductor-metal detector.

29. The optoelectronic device of claim 25 wherein the photodetector comprises an avalanche photodiode.

\* \* \* \* \*